US012764858B2

(12) United States Patent
Ishizaki et al.

(10) Patent No.: US 12,764,858 B2
(45) Date of Patent: Oct. 13, 2026

(54) LAMINATION FLEXIBLE CIRCUIT DEVICE, FLEXIBLE CAPACITANCE SENSOR, FLEXIBLE ACTUATOR, AND FLEXIBLE BATTERY

(71) Applicants: HONDA MOTOR CO., LTD., Minato-ku (JP); The University of British Columbia, Vancouver (CA)

(72) Inventors: Ryusuke Ishizaki, Wako (JP); Takeshi Osato, Wako (JP); Fumiya Hamatsu, Wako (JP); Shun Ogiwara, Wako (JP); John D W Madden, Vancouver (CA); Chrysanthemum Morton, Surrey (CA); Sadan Wani, Vancouver (CA); Ying Li, Richmond (CA)

(73) Assignees: HONDA MOTOR CO., LTD., Tokyo (JP); The University of British Columbia, Vancouver (CA)

( * ) Notice: Subject to any disclaimer, the term of this patent is extended or adjusted under 35 U.S.C. 154(b) by 364 days.

(21) Appl. No.: 18/539,526

(22) Filed: Dec. 14, 2023

(65) Prior Publication Data

US 2024/0206058 A1 Jun. 20, 2024

(30) Foreign Application Priority Data

Dec. 16, 2022 (JP) ................................ 2022-201141

(51) Int. Cl.

*H05K 1/02* (2006.01)
*H01M 50/136* (2021.01)
*H05K 1/03* (2006.01)

(52) U.S. Cl.

CPC ........ *H05K 1/0298* (2013.01); *H01M 50/136* (2021.01); *H05K 1/0393* (2013.01); (Continued)

(58) Field of Classification Search

None
See application file for complete search history.

(56) References Cited

U.S. PATENT DOCUMENTS 4,327,124 A * 4/1982 Des, Jr. .................. H05K 3/247 427/205
4,563,725 A * 1/1986 Kirby ..................... H05K 1/189 257/E23.09

(Continued)

FOREIGN PATENT DOCUMENTS

JP 05-206678 8/1993
JP 2005-519451 6/2005

(Continued)

OTHER PUBLICATIONS

Japanese Office Action for Japanese Patent Application No. 2022-201141 dated Jun. 3, 2025.

*Primary Examiner* — Krystal Robinson
(74) *Attorney, Agent, or Firm* — Amin, Turocy & Watson, LLP

(57) ABSTRACT

A capacitance sensor formed of a plurality of laminated layers includes: a first conductive portion; a second conductive portion arranged to face the first conductive portion; a first conductive wiring in a layer identical to the first conductive portion; a second conductive wiring in a layer identical to the second conductive portion; and a flexible base material having a dielectric property and elasticity and arranged between the first conductive portion and the second conductive portion, wherein a third conductive wiring connecting the first conductive portion or the first conductive wiring to the second conductive portion or the second conductive wiring between layers is arranged on the flexible base material.

18 Claims, 9 Drawing Sheets

(52) U.S. Cl.
CPC .............. *H05K 2201/10151* (2013.01); *H05K 2201/10977* (2013.01)

(56) References Cited

U.S. PATENT DOCUMENTS

| | | | | |
|---|---|---|---|---|
| 4,783,359 | A * | 11/1988 | Fleischer .................. | H01P 9/00 428/209 |
| 5,702,222 | A * | 12/1997 | Rosen ........................ | E04H 6/06 187/214 |
| 2002/0001937 | A1 * | 1/2002 | Kikuchi ................ | H10W 70/05 438/618 |
| 2003/0170542 | A1 | 9/2003 | Barker et al. | |
| 2003/0190527 | A1 | 10/2003 | Pugh et al. | |
| 2004/0061105 | A1 * | 4/2004 | St. Lawrence ........ | H10W 70/69 257/40 |
| 2005/0189139 | A1 * | 9/2005 | Stole ..................... | H01M 50/24 29/846 |
| 2011/0005821 | A1 * | 1/2011 | Marttila ............... | G08B 13/244 174/258 |
| 2014/0182899 | A1 * | 7/2014 | Li ........................ | H05K 3/4691 156/92 |
| 2014/0290989 | A1 * | 10/2014 | Su .......................... | H05K 1/115 174/254 |
| 2016/0301382 | A1 | 10/2016 | Iwamoto | |
| 2017/0208683 | A1 * | 7/2017 | Yu ........................ | H05K 1/0219 |
| 2018/0020538 | A1 * | 1/2018 | Liu ...................... | H05K 3/4691 |
| 2022/0228938 | A1 | 7/2022 | Ishizaki et al. | |

FOREIGN PATENT DOCUMENTS

| | | |
|---|---|---|
| JP | 2005-522009 | 7/2005 |
| JP | 2010-122018 | 6/2010 |
| JP | 2010-223953 | 10/2010 |
| JP | 2021-162384 | 10/2021 |
| JP | 2022-007045 | 1/2022 |
| JP | 2022-055908 | 4/2022 |
| JP | 2022-105964 | 7/2022 |
| JP | 2022-111488 | 8/2022 |
| WO | 2015/098793 | 7/2015 |

* cited by examiner

LAMINATION FLEXIBLE CIRCUIT DEVICE, FLEXIBLE CAPACITANCE SENSOR, FLEXIBLE ACTUATOR, AND FLEXIBLE BATTERY

CROSS-REFERENCE TO RELATED APPLICATION

Priority is claimed on Japanese Patent Application No. 2022-201141, filed on Dec. 16, 2022, the contents of which are incorporated herein by reference.

BACKGROUND

Field of the Invention

The present invention relates to a lamination flexible circuit device, a flexible capacitance sensor, a flexible actuator, and a flexible battery.

Background

In apparatuses that interact with people, wearable devices, and robots, flexibility on the surfaces thereof is required from the viewpoint of comfort and safety. In devices and robots having a movable portion, it is preferable that the surface skin have stretch properties.

On the other hand, in these devices and robots, from the viewpoint of realizing multi-functionalization and downsizing of the system, it is important to realize a functional surface skin that can incorporate an electrical circuit without separating the flexible surface skin and the electrical circuit. For example, it is required to realize a functional surface skin that can incorporate a flexible wiring for electric power supply and/or a flexible wiring for communication, a flexible sensor electrode, a flexible electrode for an actuator, a flexible electrode for a battery, and the like.

In the related art, most flexible circuits (FSC; Flexible Stretchable Circuit) in which electrodes and wiring are flexible have a structure made of only a single layer.

In multilayer circuits, with respect to junctions between layers, via holes used for a multilayer FPC (Flexible Printed Circuit) are known.

Further, as an example of a flexible circuit, in a flexible capacitance sensor used as a touch sensor or the like, the position between electrodes spaced from each other and facing each other is changed, and thereby, predetermined sensing is enabled.

Here, the detection characteristic in a sensor is greatly affected by the change amount of a relative position such as a distance between laminated electrodes. Therefore, a structure is required which maintains the electrodes in a predetermined relative positional relationship and supports the electrodes to be promptly displaceable in response to a sensing amount.

Flexible sensors may have a structure in which a plurality of sensors are aligned on the same surface.

When downsizing is attempted while maintaining the detection characteristic in a sensor, it is conceivable that a plurality of sensors be laminated. Alternatively, in order to connect electrodes, wiring, or the like, it is known to use a via hole and connect the layers.

The Applicants have already filed an application regarding a capacitance sensor in Japanese Unexamined Patent Application, First Publication No. 2022-105964.

SUMMARY

In flexible circuits (FSCs) in which electrodes and wiring are flexible, in a single layer structure, the area of wiring is increased when the circuit scale is increased, and it is difficult to realize downsizing. Therefore, it is conceivable that a multilayer structure be used for the flexible circuit. However, in the flexible circuit, a practical method for obtaining the multilayer structure that can prevent disconnection between layers at the time of application of a shear load has not been realized as yet.

As an example of connection between layers when obtaining the multilayer structure of the flexible circuit, a structure is known in which pressure bonding is performed by inserting a metal body such as a rivet or a snap button between layers. However, in such a structure, since the via hole or the like is a hard material while other portions in the flexible circuit have flexibility, there is a problem in that it is difficult to maintain flexibility of the entire flexible circuit, and there is a problem in that disconnection may occur or the like when a strong shear force is applied.

Further, in rigid FPCs that can use a via hole, bending deformation is possible, but such rigid FPCs do not have stretch properties. The FPC is required to have further flexibility as a flexible circuit since disconnection occurs when strong stress (a bending force or a shear force) is applied to the via portion.

Further, when obtaining the multilayer structure of the flexible circuit, it is difficult to downsize a structure using the conventionally used rigid FPC, a structure in which bonding using a solder is performed, or the like.

For example, in a flexible sensor as an example of a flexible circuit, in the case of a structure in which a plurality of sensors are aligned in the same layer, there is a problem in that when the number of electrodes is increased, the area required for the wiring connected to an individual electrode is increased. When the spacing of the wiring is decreased in order to downsize the sensor, since the S/N ratio is deteriorated, it is difficult to downsize the structure in which the plurality of sensors are aligned in the same layer.

Even in the case of the structure in which a plurality of sensors are laminated, the wiring is formed for each layer, and it is difficult to downsize the sensor. At the same time, when the spacing of the wiring is decreased, wiring crosstalk between the layers may occur, and there is a problem in that the wiring region increases in order to prevent wiring crosstalk.

Further, in the flexible sensor, when connecting the layers using the via hole, since the via hole is made of a hard material while other portions have flexibility, there is a problem in that disconnection may occur or the like when a strong shear force is applied at the time of detection or the like in the sensor.

An aspect of the present invention aims at providing a lamination flexible circuit device, a flexible capacitance sensor, a flexible actuator, and a flexible battery that can sufficiently prevent the occurrence of disconnection in a lamination flexible circuit, have a degree of freedom of wiring to the same extent as rigid FPCs which can use via holes, and enable downsizing and noise reduction.

A first aspect of the present invention is a lamination flexible circuit device formed of a plurality of laminated layers, the lamination flexible circuit device including: a first conductive portion: a second conductive portion arranged to face the first conductive portion: a first conductive wiring in a layer identical to the first conductive portion: a second conductive wiring in a layer identical to the second conductive portion; and a flexible base material having a dielectric property and elasticity and arranged between the first conductive portion and the second conductive portion, wherein a third conductive wiring connecting the first conductive portion or the first conductive wiring to the second conductive portion or the second conductive wiring between layers is arranged on the flexible base material.

A second aspect is the lamination flexible circuit device according to the first aspect described above which may include: a first layer including the first conductive portion and the first conductive wiring: and a second layer including the second conductive portion and the second conductive wiring, wherein at least one of the first layer and the second layer may be formed of a material identical to the flexible base material.

A third aspect is the lamination flexible circuit device according to the second aspect described above, wherein the flexible base material may be formed of a plurality of pillars extending in a lamination direction between the first layer and the second layer and arranged to be spaced from each other in a direction intersecting the lamination direction.

A fourth aspect is the lamination flexible circuit device according to the third aspect described above, wherein the third conductive wiring may penetrate through an inside of a pillar among the plurality of pillars in the lamination direction, and the third conductive wiring may be exposed to a surface of the pillar or may not be exposed to the surface of the pillar.

A fifth aspect is the lamination flexible circuit device according to the third aspect described above, wherein the third conductive wiring may extend in the lamination direction within a pillar among the plurality of pillars between the first layer and the second layer, and the third conductive wiring may be exposed to a surface of the pillar or may not be exposed to the surface of the pillar.

A sixth aspect is the lamination flexible circuit device according to the first aspect described above which may include a plurality of third conductive wirings each of which is the third conductive wiring and which are arranged to be spaced from each other in a direction intersecting a lamination direction, and the third conductive wiring that is connected to the first conductive portion or the second conductive portion may be arranged to be surrounded by the third conductive wiring that is not connected to the first conductive portion or the second conductive portion.

A seventh aspect is the lamination flexible circuit device according to the second aspect described above which may include a fourth conductive wiring that penetrates through at least one of the first layer and the second layer in a lamination direction.

An eighth aspect is the lamination flexible circuit device according to the second aspect described above, wherein a circuit board overlapping the first layer or the second layer in a lamination direction may be connected in the lamination direction to at least one of the first layer and the second layer.

A ninth aspect of the present invention is a capacitance sensor including the lamination flexible circuit device according to any one of the first to eighth aspects described above, wherein the first conductive portion has a section overlapping the second conductive portion when seen in a lamination direction, and a capacitance between the first conductive portion and the second conductive portion is detected.

A tenth aspect of the present invention is a flexible actuator including the lamination flexible circuit device according to any one of the first to eighth aspects described above, wherein the first conductive portion or the first conductive wiring has a section overlapping the second conductive portion or the second conductive wiring when seen in a lamination direction.

An eleventh aspect of the present invention is a flexible battery including the lamination flexible circuit device according to any one of the first to eighth aspects described above, wherein the first conductive portion has a section overlapping the second conductive portion when seen in a lamination direction, the first conductive portion is an anode, the second conductive portion is a cathode, and a separator layer is provided between the first conductive portion and the second conductive portion.

According to the first aspect described above, by connecting the laminated first electrode (first conductive portion) or the first conductive wiring to the second electrode (second conductive portion) or the second conductive wiring between layers by way of the third conductive wiring and by arranging the third conductive wiring on the flexible base material, it becomes possible to arrange the wiring through different layers. Further, it is possible to realize the same degree of flexibility in all of the first electrode (first conductive portion), the first conductive wiring, the second electrode (second conductive portion), the second conductive wiring, and the third conductive wiring, and deformation of all of these components with respect to a load applied to the lamination flexible circuit device can be of the same degree. Thereby, in the first electrode (first conductive portion), the first conductive wiring, the second electrode (second conductive portion), the second conductive wiring, and the third conductive wiring, resistance characteristics to a shear force generated by the external load applied to the lamination flexible circuit device or to disconnection due to deformation can be improved.

Further, it becomes possible to increase the distance between the wirings compared to the case where the wirings are arranged in the same layer, reduce the effect of noise, and prevent the decrease of the S/N ratio. At the same time, since the wiring can be arranged through different layers, the degree of freedom of layout between the wirings can be improved by removing a wiring to a different level or the like, and the lamination flexible circuit device can be downsized. Further, since a hard material such as the via hole is not used, resistance characteristics to a shear force generated by an applied external load or to disconnection due to deformation can be improved.

According to the second aspect described above, the flexible base material is made of the same material as any one of the first layer and the second layer, and thereby, uniform flexibility can be achieved at the interface or the boundary of the layer. Thereby, the degree of deformation corresponding to stress can be uniform without changing the flexibility at the interface or the boundary of the layer, and it is possible to prevent the occurrence of a non-uniform state with respect to variation in a relative position between the electrodes (conductive portions). Thereby, for example, when the lamination flexible circuit device is a flexible capacitance sensor, the capacitance change due to the relative displacement between the electrodes (conductive portions) can be set to a predetermined state, and deterioration of the sensor characteristic can be prevented.

At the same time, resistance characteristics to a shear force generated by the external load applied to the lamination flexible circuit device or to disconnection due to deformation can be improved.

According to the third aspect described above, by forming the pillar between the first layer and the second layer having electrodes (conductive portions), respectively, and connecting the first layer to the second layer, the position displacement between the electrodes (conductive portions) can be made large by the pillar even when the same external force is applied. Accordingly, for example, in the case of the flexible capacitance sensor, it is possible to prevent deterioration of the detection accuracy as a sensor. At the same time, the detection accuracy as a sensor can be improved. Further, by forming the third conductive wiring in the pillar, the resistance characteristic to disconnection caused by flexibility at the connection position of each layer being different can be improved. By forming the third conductive wiring in the pillar, it is possible to reduce the size and improve the detection accuracy as a sensor.

Further, by setting the arrangement of the pillar to a predetermined position in a direction along a facing surface of the electrodes (conductive portions), it is possible to easily enlarge the range of choice of the connection position between layers by the third conductive wiring in consideration of the arrangement of the pillar. Thereby, the degree of freedom of layout between the wirings can be improved, and the lamination flexible circuit device can be downsized. At the same time, it becomes possible to reduce the effect of noise and prevent the decrease of the S/N ratio.

According to the fourth aspect described above, since the third conductive wiring can follow the deformation of the pillar, resistance characteristics to a shear force generated by the external load applied to the lamination flexible circuit device or to disconnection due to deformation can be improved. At the same time, the width of the third conductive wiring can be increased in accordance with the peripheral size of the pillar, and resistance characteristics to disconnection due to deformation can be improved.

Further, by forming a conductive portion which becomes a GND shield around the pillar and electrically surrounding the third conductive wiring, the third conductive wiring can be a coaxial cable in the pillar, and low crosstalk can be achieved.

Further, by forming the third conductive wiring on the entire circumference of the pillar and connecting the third conductive wiring to a wiring that becomes a GND potential, the GND shield can be obtained. In particular, by arranging a wiring connected to an electrode along the lamination direction at the middle of the pillar, the third conductive wiring around the pillar can be electrically surrounded as a GND shield. Thereby, the conductive wiring can be a coaxial cable in the pillar, and low crosstalk can be achieved.

According to the fifth aspect described above, since the third conductive wiring can follow the deformation of the pillar, resistance characteristics to a shear force generated by the external load applied to the lamination flexible circuit device or to disconnection due to deformation can be improved. At the same time, the width of the third conductive wiring can be increased in accordance with the peripheral size of the pillar, and resistance characteristics to disconnection due to deformation can be improved.

Thereby, the conductive wiring can be a coaxial cable in the pillar, and low crosstalk can be achieved.

According to the sixth aspect described above, by surrounding the third conductive wiring connected to the electrode (conductive portion), that is, a signal line arranged in the lamination direction and connecting between the layers, with a conductive portion that is not connected to the signal line, shield effects for the surrounded signal line from a portion which is further spaced can be exerted, and it is possible to reduce the occurrence of crosstalk. Further, by surrounding the entire length in the circumferential direction with respect to the signal line, low crosstalk at an interlayer wiring layout location can be achieved by the wiring in the pillar becoming the coaxial cable.

Here, the surrounding arrangement does not need to surround the entire circumference physically continuously, may be located at a position at which the electric shield can be achieved, and physically includes an intermittently surrounding state in the circumferential direction. Further, the arrangement is similar in the lamination direction and may use physical separation, but continuity in which the electric shield can be achieved is required.

According to the seventh aspect described above, the conductive wirings connected to the electrode (conductive portion) or the conductive wiring includes the fourth conductive wiring that not only connects between layers but also penetrates through the first layer or the second layer in the lamination direction and connects between front and rear surfaces of the first layer or the second layer, and thereby, it is possible to further improve the degree of freedom of the wiring layout. The fourth conductive wiring and the third conductive wiring can be continuous with each other or can be connected via another wiring or an electrode.

According to the eighth aspect described above, by arranging the circuit board at a position overlapping each layer when seen in the lamination direction, the degree of freedom of the wiring layout can be enhanced compared to the case where the circuit board is arranged in the same layer. At the same time, the size of the contour can be decreased, and the lamination flexible circuit device can be downsized. Further, since it is possible to reduce the distance between the circuit board and the connected layer and decrease the length of the wiring, it becomes possible to prevent the occurrence of crosstalk.

According to the ninth aspect described above, it becomes possible to provide a flexible capacitance sensor that is capable of connecting the electrode or the wiring between layers, enables downsizing while improving the degree of freedom of the wiring layout, is capable of preventing the decrease of the S/N ratio, is capable of detecting a shear force, an external load in a three-axis direction, or a proximity state, and is capable of preventing the occurrence of disconnection simultaneously.

According to the tenth aspect described above, it becomes possible to provide a flexible actuator that is capable of connecting the electrode or the wiring between layers, enables downsizing while improving the degree of freedom of the wiring layout, is capable of preventing the decrease of the S/N ratio, is capable of detecting a shear force, an external load in a three-axis direction, or a proximity state, and is capable of preventing the occurrence of disconnection simultaneously.

According to the eleventh aspect described above, it becomes possible to provide a flexible battery that is capable of connecting the electrode or the wiring between layers, enables downsizing while improving the degree of freedom of the wiring layout, is capable of preventing the decrease of the S/N ratio, is capable of detecting a shear force, an external load in a three-axis direction, or a proximity state, and is capable of preventing the occurrence of disconnection simultaneously.

According to an aspect of the present invention, it becomes possible to provide advantages of providing a capacitance sensor that enables downsizing while improving the degree of freedom of the wiring layout, is capable of preventing the decrease of the S/N ratio, is capable of detecting a shear force, an external load in a three-axis direction, or a proximity state, and is capable of preventing the occurrence of disconnection simultaneously.

DESCRIPTION OF EMBODIMENTS

Hereinafter, a capacitance sensor according to a first embodiment of the present invention will be described with reference to the drawings.

Figure 1:
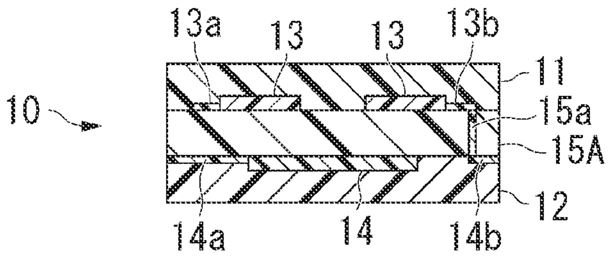
FIG. 1 is a schematic cross-sectional view showing a lamination flexible circuit device (capacitance sensor) according to a first embodiment of the present invention.

FIG. 1 is a schematic cross-sectional view showing a capacitance sensor in the present embodiment. In FIG. 1, reference numeral 10 represents a capacitance sensor (lamination flexible circuit device).

The capacitance sensor (lamination flexible circuit device) 10 according to the present embodiment includes a first electrode support layer (first layer) 11, a second electrode (second conductive portion) 14, a first electrode (first conductive portion) 13, a second electrode support layer (second layer) 12, and a flexible base material 15A, as shown in FIG. 1.

The first electrode support layer (first layer) 11 includes the first electrode (first conductive portion) 13. The second electrode support layer (second layer) 12 includes the second electrode (second conductive portion) 14 arranged to face the first electrode support layer 11. The flexible base material 15A connects the first electrode support layer 11 to the second electrode support layer 12 in a lamination direction.

The first electrode support layer 11, the second electrode support layer 12, and the flexible base material 15A are an elastomer layer which is a dielectric and is made of an elastically deformable elastomer. The first electrode support layer 11, the second electrode support layer 12, and the flexible base material 15A can be bonded by an adhesion layer (not shown) that is made of the same material as the elastomeric layer.

The first electrode support layer 11, the second electrode support layer 12, and the flexible base material 15A are a curable elastomer after application. For example, a thermosetting resin or the like can be preferably selected as a material of the first electrode support layer 11, the second electrode support layer 12, and the flexible base material 15A.

The first electrode support layer 11, the second electrode support layer 12, and the flexible base material 15A are formed to be elastically deformable by a flexible dielectric made of, for example, a gel of polyvinyl chloride (PVC), polyvinylidene fluoride (PVDF), polydimethylsiloxane (PDMS), a silicon-based resin, a urethane-based resin, an epoxy-based resin, a composite material thereof, or the like. A material that does not have reversibility with respect to a curing process described later can be preferably selected as the elastomer.

Both of the first electrode 13 and the second electrode 14 are made of an electric conductor having a stretch property.

The first electrode 13 and the second electrode 14 can be formed of a resin such as a silicon-based resin in which an electric conductor such as carbon, carbon nanofiber, or graphite is incorporated, a resin such as a silicon-based resin containing a metal conductive filler such as silver or copper or the like, a thiophene-based conductive polymer, a conductive resin such as polystyrene sulfonic acid (PSS), or a composite material thereof.

The first electrode 13 is formed in the first electrode support layer 11. The first electrode 13 may be included in a thickness direction of the first electrode support layer 11. The first electrode 13 may be formed to be exposed to any surface of the first electrode support layer 11. The first electrode 13 may be formed in a predetermined shape when forming the first electrode support layer 11. The first electrode 13 may be formed by incorporating a conductive material such as carbon powder, carbon nanofiber, or metal powder into the same material as the first electrode support layer 11.

In the first electrode 13, the formation shape and the formation position in a thickness direction of the first electrode support layer 11 or in an in-plane direction of the first electrode support layer 11 and the formation number can be set in advance in accordance with the sensor characteristic. For example, a plurality of first electrodes 13 may be arranged in the same layer in the first electrode support layer 11 and can be arranged, for example, at right and left positions as shown in FIG. 1.

The first electrode support layer 11 has a first conductive wiring 13*a* and a first conductive wiring 13*b* in the same layer as the first electrode 13. Here, in FIG. 1, the wiring connected to the right first electrode 13 is the first conductive wiring 13*b*, and the wiring connected to the left first electrode 13 is the first conductive wiring 13*a*; however, the embodiment is not limited to this configuration.

The second electrode 14 may be formed as a predetermined shape when forming the second electrode support layer 12 similarly to the first electrode 13.

For example, the second electrode 14 can be suitably arranged in the second electrode support layer 12 and can be arranged, for example, between the first electrodes 13 arranged on the right and left sides as shown in FIG. 1.

The second electrode support layer 12 has a second conductive wiring 14*a* and a second conductive wiring 14*b* in the same layer as the second electrode 14. Here, in FIG. 1, the wiring that is connected to the second electrode 14 is the second conductive wiring 14*a*, and the wiring that is not connected to the second electrode 14 is the second conductive wiring 14*b*; however, the embodiment is not limited to this configuration.

A third conductive wiring 15*a* is arranged in the flexible base material 15A. The third conductive wiring 15*a* connects the first conductive wiring 13*b* to the second conductive wiring 14*b* between the layers. The third conductive wiring 15*a* penetrates through the flexible base material 15A in a lamination direction. The third conductive wiring 15*a* is connected at both ends to the first conductive wiring 13*b* and the second conductive wiring 14*b*.

The third conductive wiring 15*a* may be connected to the first electrode 13 or the second electrode 14. In the present embodiment, the third conductive wiring 15*a* may connect a conductive portion in the first electrode support layer 11 to a conductive portion in the second electrode support layer 12 between the layers of the portions. The connection target may be an electrode or may be a conductive wiring. Alternatively, it is also possible for another end located in a layer different from one end not to be connected to another conductive portion.

All of the third conductive wiring 15*a*, the first conductive wiring 13*a*, the first conductive wiring 13*b*, the second conductive wiring 14*a*, and the second conductive wiring 14*b* can be constituted of an electric conductor having a stretch property similar to those of the first electrode 13 and the second electrode 14.

In the capacitance sensor of the present embodiment, the first electrode support layer 11, the second electrode support layer 12, and the flexible base material 15A are prepared. Both of the first electrode support layer 11 and the second electrode support layer 12 can be formed in a substantially plate shape. The first electrode support layer 11, the second electrode support layer 12, and the flexible base material 15A can be molded by a predetermined mold or the like.

Further, the first electrode support layer 11, the second electrode support layer 12, and the flexible base material 15A can be made of the same material or can be made of a different material.

Further, the first electrode support layer 11, the first electrode 13, the first conductive wiring 13*a*, and the first conductive wiring 13*b* can be formed simultaneously at the time of molding. For example, a material including a conductive material corresponding to the first electrode 13, the first conductive wiring 13*a*, and the first conductive wiring 13*b* is applied in a mold recess and is cured before molding the first electrode support layer 11, then the first electrode support layer 11 is injected into the mold recess and is cured, and thereby, the first electrode support layer 11, the first electrode 13, the first conductive wiring 13*a*, and the first conductive wiring 13*b* can be simultaneously formed.

Alternatively, the first electrode 13, the first conductive wiring 13*a*, and the first conductive wiring 13*b* can be applied to the surface of the molded first electrode support layer 11, be cured, and thereby be formed. In this case, irregularities corresponding to the first electrode 13, the first conductive wiring 13*a*, and the first conductive wiring 13*b* can be formed on a mold for molding the first electrode support layer 11 at a position where the first electrode 13, the first conductive wiring 13*a*, and the first conductive wiring 13*b* are formed.

Alternatively, when the first electrode support layer 11 is formed, or after the first electrode support layer 11 is formed, a conductive material can be injected into a predetermined position at which the first electrode 13, the first conductive wiring 13*a*, and the first conductive wiring 13*b* are formed.

Similarly, the second electrode support layer 12, the second electrode 14, the second conductive wiring 14*a*, and the second conductive wiring 14*b* may be formed simultaneously. Alternatively, after the second electrode support layer 12 may be formed, the second conductive wiring 14*a* and the second conductive wiring 14*b* may be formed on the formed second electrode support layer 12. These components can be formed by a method similar to that of the first electrode support layer 11, the first electrode 13, the first conductive wiring 13*a*, and the first conductive wiring 13*b*.

Similarly, the flexible base material 15A and the third conductive wiring 15*a* may be formed simultaneously. After the flexible base material 15A may be formed, the third conductive wiring 15*a* may be formed on the formed flexible base material 15A. These components can be formed by a method similar to that of the first electrode support layer 11, the first electrode 13, the first conductive wiring 13*a*, and the first conductive wiring 13*b*.

Further, the same elastomer as the prepared first electrode support layer 11, the second electrode support layer 12, and the flexible base material 15A is applied to the interfaces of the first electrode support layer 11, the second electrode support layer 12, and the flexible base material 15A and is then cured. Thereby, the first electrode support layer 11, the second electrode support layer 12, and the flexible base material 15A can be bonded to each other, and the capacitance sensor 10 can be manufactured.

Figure 2:
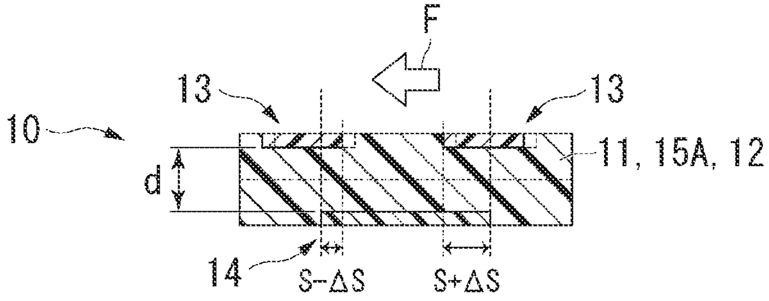
FIG. 2 is a schematic cross-sectional view showing an operation of the lamination flexible circuit device (capacitance sensor) according to the first embodiment.

FIG. 2 is a cross-sectional view showing an operation of the capacitance sensor in the present embodiment.

In the capacitance sensor 10 according to the present embodiment, as shown in FIG. 2, in a state where an external load F is not applied, an area in which the first electrode 13 and the second electrode 14 overlap each other in plan view is S.

On the other hand, when the external load F is applied, an area in which the first electrode 13 located on the right side in FIG. 2 overlaps the second electrode 14 becomes S+ΔS. Thereby, the capacitance formed of the first electrode 13 and the second electrode 14 is changed, and it becomes possible to measure the external load F by detecting this capacitance change.

Similarly, when the external load F is applied, an area in which the first electrode 13 located on the left side in FIG. 2 overlaps the second electrode 14 becomes S−ΔS. In this way, the capacitance formed of the first electrode 13 and the second electrode 14 is changed, and it becomes possible to measure the external load F by detecting this capacitance change.

At this time, all of the first electrode support layer 11, the second electrode support layer 12, and the flexible base material 15A are made of an elastomer of the same material. Therefore, all of the first electrode support layer 11, the second electrode support layer 12, and the flexible base material 15A have the same stress characteristic. Accordingly, the first electrode support layer 11, the second electrode support layer 12, and the flexible base material 15A do not have specificity of deformation such as locally different hardness or local softness. The first electrode support layer 11, the second electrode support layer 12, and the flexible base material 15A have a uniform degree of deformation.

Further, both an interface between the first electrode support layer 11 and the flexible base material 15A and an interface between the second electrode support layer 12 and the flexible base material 15A are capable of maintaining a state of having the same stress characteristic. Therefore, all of the first electrode support layer 11, the second electrode support layer 12, and the flexible base material 15A are similarly deformed with respect to the applied external load F. Accordingly, discontinuity in the deformation characteristic on the bonding surface does not occur. That is, all of the first electrode support layer 11, the second electrode support layer 12, and the flexible base material 15A are similarly deformed with respect to the applied external load F.

Thereby, it becomes possible to accurately detect the change in capacitance between the first electrode 13 and the second electrode 14. That is, the first electrode support layer 11, the second electrode support layer 12, and the flexible base material 15A are similarly deformed regardless of the presence or absence of the bonding surface with respect to the applied external load F. Thereby, it becomes possible to accurately detect the change in capacitance between the first electrode 13 and the second electrode 14.

Here, all of the first electrode 13, the second electrode 14, the third conductive wiring 15*a*, the first conductive wiring 13*a*, the first conductive wiring 13*b*, the second conductive wiring 14*a*, and the second conductive wiring 14*b* use the same elastomer as the first electrode support layer 11, the second electrode support layer 12, and the flexible base material 15A. Therefore, all of these components have almost the same stress characteristic. Further, since the interfaces between these components are formed of the same material and thereby have a uniform characteristic, stress concentration does not occur, and it is possible to enhance the peeling resistance property. At the same time, at the interfaces between these components, since the components are formed of elastomers having the same molecular structure, the bond is strong, and the components are not easily peeled from each other. Therefore, the degree of deformation when the external load F is applied is uniform. Accordingly, it is possible to prevent the occurrence of disconnection caused by the external load F. Thereby, it becomes possible to maintain a disconnection resistance characteristic required for the capacitance sensor 10.

In FIG. 2, the applied external load F is directed in the rightward-leftward direction in the drawing: however, the external load F can be applied in the thickness direction of the first electrode support layer 11 and the second electrode support layer 12.
In this case, the change in capacitance between the first electrode 13 and the second electrode 14 is detected by an interelectrode distance d.

Hereinafter, a capacitance sensor (lamination flexible circuit device) according to a second embodiment of the present invention will be described with reference to the drawings.

Figure 3:
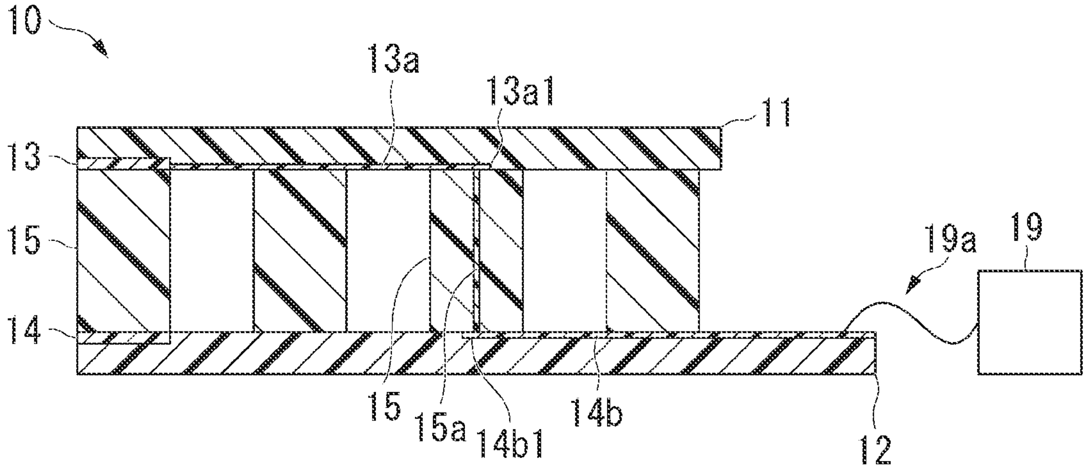
FIG. 3 is a schematic cross-sectional view showing a lamination flexible circuit device (capacitance sensor) according to a second embodiment of the present invention.
Figure 4:
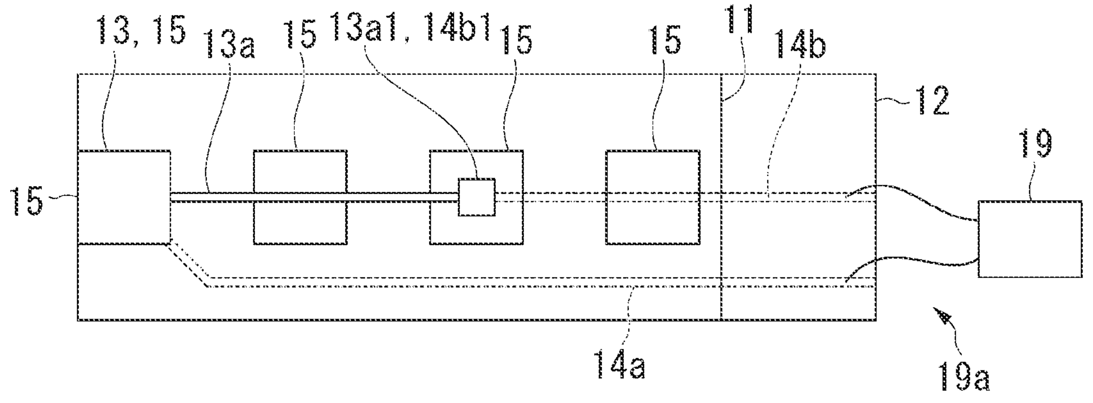
FIG. 4 is a schematic top view showing the lamination flexible circuit device (capacitance sensor) according to the second embodiment.

FIG. 3 is a schematic cross-sectional view showing a capacitance sensor in the present embodiment. FIG. 4 is a schematic top view showing the capacitance sensor in the present embodiment. The present embodiment is different from the first embodiment described above in terms of a pillar. Other configurations corresponding to those of the first embodiment described above may be denoted by the same reference numerals, and descriptions thereof may be omitted.

In a capacitance sensor 10 in the present embodiment, as shown in FIG. 3 and FIG. 4, a plurality of pillars 15 having a column shape are formed between the first electrode support layer 11 and the second electrode support layer 12. All of the plurality of pillars 15 are in the same layer and constitute a flexible base material.

The plurality of pillars 15 are formed along an in-plane direction of the first electrode support layer 11 and the second electrode support layer 12 and are spaced from each other. The pillars 15 can be formed integrally with the second electrode support layer 12. All of the pillars 15 can have the same height. The pillars 15 can have different heights depending on an in-plane position of the first electrode support layer 11 and the second electrode support layer 12. The heights of the pillars 15 can be changed to be inclined in one direction. The heights of the pillars 15 can be set in accordance with the sensor characteristic.

The first electrode 13 and the first conductive wiring 13*a* are formed in the first electrode support layer 11. The first electrode 13 and the first conductive wiring 13*a* may be included in the thickness direction of the first electrode support layer 11. The first electrode 13 and the first conductive wiring 13*a* may be formed to be exposed on the surface of the first electrode support layer 11 facing the second electrode support layer 12. A plurality of first electrodes 13 can be formed at a plurality of locations in the same layer.

The second electrode 14, the second conductive wiring 14*a*, and the second conductive wiring 14*b* are formed in the second electrode support layer 12. The second electrode 14, the second conductive wiring 14*a*, and the second conductive wiring 14*b* may be included in the thickness direction of the second electrode support layer 12. The second electrode 14, the second conductive wiring 14*a*, and the second conductive wiring 14*b* may be formed to be exposed on the surface of the second electrode support layer 12 facing the first electrode support layer 11. A plurality of second electrodes 14 can be formed at a plurality of locations in the same layer.

A third conductive wiring 15*a* penetrating in the lamination direction is arranged in a pillar 15 arranged at a predetermined in-plane position of the plurality of pillars. In the present embodiment, the third conductive wiring 15*a* is arranged at the middle of the pillar 15. That is, the third conductive wiring 15*a* penetrates along a center axis of the pillar 15. A first end and a second end of the third conductive wiring 15*a* are connected to the first conductive wiring 13*a* and the second conductive wiring 14*b*, respectively.

An area of end portions of the first conductive wiring 13*a* and the second conductive wiring 14*b* connected to the third conductive wiring 15*a*, as a connection position 13*al*, as shown in FIG. 4, can be larger than the width of other portions of the first conductive wiring 13*a* in a top view. Thereby, it is possible to maintain reliable connection between the connection position 13*al* and the third conductive wiring 15*a*. At the end portion of the second conductive wiring 14*b*, a connection position 14*b*1 can be formed similarly to the end portion of the first conductive wiring 13*a*, and it is possible to maintain reliable connection with the third conductive wiring 15*a*.

An end portion of the pillar 15 is bonded to the opposing first electrode support layer 11. All of the end portions of the pillars 15 can be bonded to the first electrode support layer 11. Some of the end portions of the pillars 15 may not be bonded to the first electrode support layer 11. An adhesion layer may be formed between a bonding section of the end portion of the pillar 15 and the first electrode support layer 11. The adhesion layer can be formed on the entire bonding section in the end portion of the pillar 15. The adhesion layer can be formed on the bonding section of the pillar 15 in part of the end portion.

All of the first electrode support layer 11, the second electrode support layer 12, and the pillar 15 can be made of the same material. The first electrode support layer 11, the second electrode support layer 12, and the pillar 15 are formed of the same elastomer similarly to the first embodiment. All of the first electrode 13, the second electrode 14, the third conductive wiring 15*a*, the first conductive wiring 13*a*, the first conductive wiring 13*b*, the second conductive wiring 14*a*, and the second conductive wiring 14*b* use the same elastomer as the first electrode support layer 11, the second electrode support layer 12, and the flexible base material 15A.

In the present embodiment, the first electrode 13 is connected to a circuit board 19 via the first conductive wiring 13*a*, the third conductive wiring 15*a*, and the second conductive wiring 14*b*. The second electrode 14 is connected to the circuit board 19 via the second conductive wiring 14*a*.

The second conductive wiring 14*b* and the second conductive wiring 14*a* are arranged on the same surface of the second electrode support layer 12 and are connected to the circuit board 19 via a connection line (cable) 19*a*.

Figure 5:
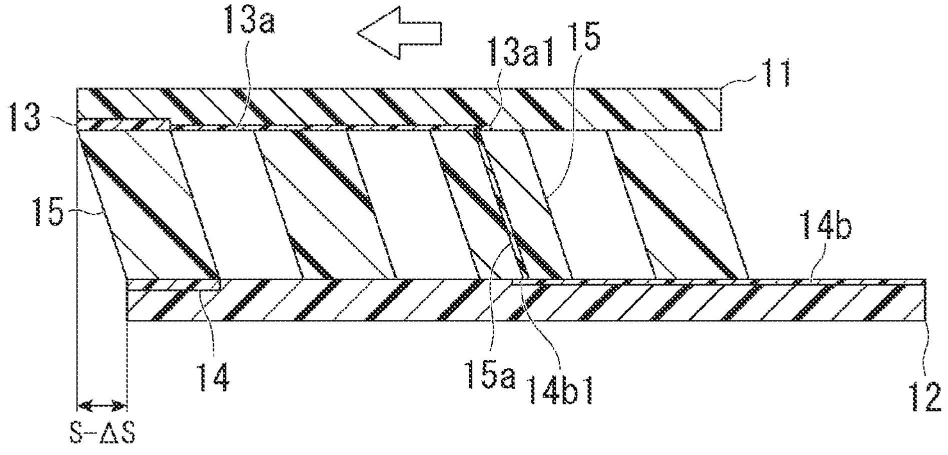
FIG. 5 is a schematic cross-sectional view showing an operation of the lamination flexible circuit device (capacitance sensor) according to the second embodiment.
Figure 6:
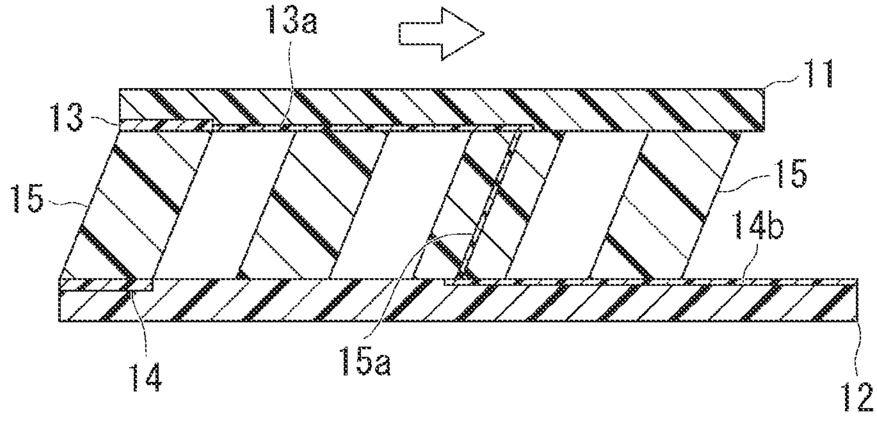
FIG. 6 is a schematic cross-sectional view showing an operation of the lamination flexible circuit device (capacitance sensor) according to the second embodiment.

FIG. 5 is a cross-sectional view showing an operation of the capacitance sensor in the present embodiment. FIG. 6 is a cross-sectional view showing an operation of the capacitance sensor in the present embodiment.

In the capacitance sensor 10 according to the present embodiment, as shown in FIG. 4, in a state where an external load F is not applied, an area in which the first electrode 13 and the second electrode 14 overlap each other in plan view is S.

On the other hand, when an external load F facing leftward is applied in FIG. 5, an area in which the first electrode 13 and the second electrode 14 overlap each other becomes S−ΔS. Similarly, when the external load F is applied, an area in which the first electrode 13 located on the left side in FIG. 6 overlaps the second electrode 14 becomes S−ΔS.

Thereby, the capacitance formed of the first electrode 13 and the second electrode 14 is changed, and it becomes possible to measure the external load F by detecting this capacitance change.

Further, as shown in FIG. 5 and FIG. 6, even when an external load F that becomes a shear force is applied, by the third conductive wiring deflecting together with the pillar 15, electrical conduction between the layers is maintained, and it is possible to prevent disconnection.

At this time, in the capacitance sensor 10 according to the present embodiment, since bonding is achieved by the plurality of pillars 15 spaced from each other in the in-plane direction compared to the first embodiment in which the entire surface of the first electrode support layer 11 and the second electrode support layer 12 is bonded by the flexible base material 15A, the position change in the in-plane direction between the first electrode support layer 11 and the second electrode support layer 12 more easily occurs. That is, the sensitivity as the sensor characteristic can be improved.

At this time, all of the first electrode support layer 11, the second electrode support layer 12, and the pillar 15 are made of an elastomer of the same material. Further, the first electrode 13, the first conductive wiring 13*a*, the third conductive wiring 15*a*, and the second conductive wiring 14*b* are also made of a flexible conductive material of the same material. Therefore, all of the first electrode support layer 11, the second electrode support layer 12, and the pillar 15 have the same stress characteristic. Accordingly, the first electrode support layer 11, the second electrode support layer 12, and the pillar 15 do not have specificity of deformation such as locally different hardness or local softness. The first electrode support layer 11, the second electrode support layer 12, and the pillar 15 have a uniform degree of deformation.

That is, the first electrode support layer 11 and the second electrode support layer 12 are similarly deformed with respect to the applied external load F. Thereby, the first electrode 13, the first conductive wiring 13*a*, the third conductive wiring 15*a*, and the second conductive wiring 14*b* are also similarly deformed, and disconnection does not occur. It becomes possible to accurately detect the change in capacitance between the first electrode 13 and the second electrode 14.

The capacitance sensor 10 according to the present embodiment can also detect the change in capacitance between the first electrode 13 and the second electrode 14 by way of the variation of an interelectrode distance d similarly to the first embodiment.

In the present embodiment, it is possible to provide effects similar to those of the embodiment described above.

Hereinafter, a capacitance sensor (lamination flexible circuit device) according to a third embodiment of the present invention will be described with reference to the drawings.

Figure 7:
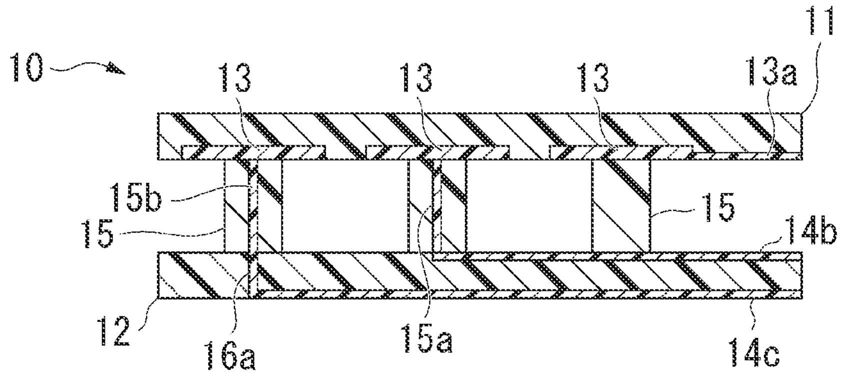
FIG. 7 is a schematic cross-sectional view showing a lamination flexible circuit device (capacitance sensor) according to a third embodiment of the present invention.
Figure 8:
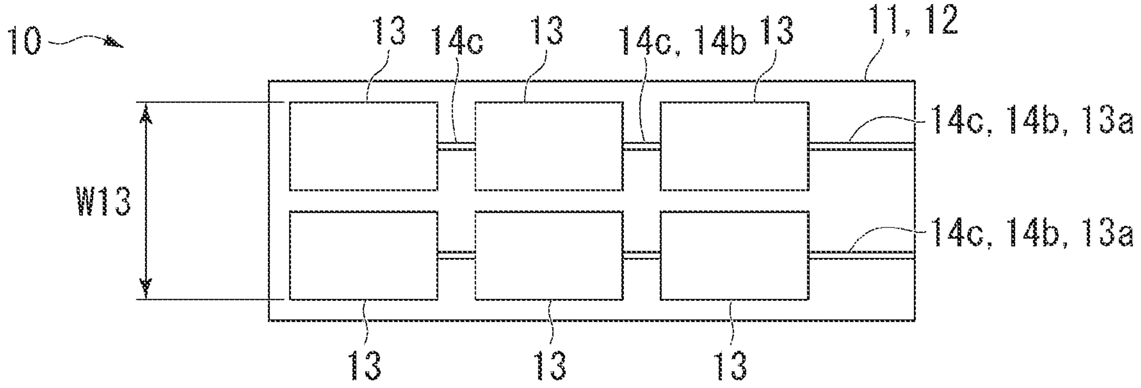
FIG. 8 is a schematic top view showing the lamination flexible circuit device (capacitance sensor) according to the third embodiment.

FIG. 7 is a schematic cross-sectional view showing a capacitance sensor in the present embodiment. FIG. 8 is a schematic top view showing the capacitance sensor in the present embodiment. The present embodiment is different from the first and second embodiments described above in terms of a fourth conductive wiring. Other configurations corresponding to those of the first and second embodiments described above may be denoted by the same reference numerals, and descriptions thereof may be omitted.

In the capacitance sensor 10 in the present embodiment, as shown in FIG. 7 and FIG. 8, a total of six first electrodes 13 constituted of two rows of three electrodes 13 forming one row are arranged on the first electrode support layer 11. The three first electrodes 13 in the row are arranged to be equally spaced. The first electrodes 13 in each row are arranged to be equally spaced. The pillar 15 is arranged to overlap each of all the six first electrodes 13 when seen in the lamination direction.

The first conductive wiring 13*a* is connected to a first electrode 13 arranged at a right end of FIG. 8. The first conductive wiring 13*a* extends in a direction in which a row formed of the three first electrodes 13 extends.

The third conductive wiring 15*a* is connected to a first electrode 13 arranged at the middle of FIG. 8 at a position which becomes an outline middle of the first electrode 13 when seen in the lamination direction. The third conductive wiring 15*a* penetrates through the pillar 15 in the lamination direction and is connected to the second conductive wiring 14*b* formed on the second electrode support layer 12. The second conductive wiring 14*b* extends on the surface of the second electrode support layer 12 facing the first electrode support layer 11. The second conductive wiring 14*b* is arranged in parallel with the first conductive wiring 13*a*. The second conductive wiring 14*b* and the first conductive wiring 13*a* are located at positions that overlap each other when seen in the lamination direction.

A third conductive wiring 15*b* is connected to a first electrode 13 arranged at the left end of FIG. 8 at a position which becomes an outline middle of the first electrode 13 when seen in the lamination direction. The third conductive wiring 15*b* penetrates through the pillar 15 in the lamination direction and is connected to a fourth conductive wiring 16*a* formed on the second electrode support layer 12. The fourth conductive wiring 16*a* penetrates through the second electrode support layer 12 in the thickness direction. The fourth conductive wiring 16*a* extends in parallel with the third conductive wiring 15*b*. The extension directions of the fourth conductive wiring 16*a* and the third conductive wiring 15*b* match each other when seen in the lamination direction.

The third conductive wiring 15*b* is connected to one end portion of the fourth conductive wiring 16*a* in the same layer as a front surface of the second electrode support layer 12. A second conductive wiring 14*c* is connected to the other end portion of the fourth conductive wiring 16*a* in the same layer as a rear surface of the second electrode support layer 12.

The second conductive wiring 14*c* extends on the rear surface of the second electrode support layer 12 on a side spaced from the first electrode support layer 11. The second conductive wiring 14*c* is arranged in parallel with the second conductive wiring 14*b* and the first conductive wiring 13*a*. The second conductive wiring 14*c*, the second conductive wiring 14*b*, and the first conductive wiring 13*a* are located at positions that overlap one another when seen in the lamination direction.

All of the fourth conductive wiring 16*a*, the third conductive wiring 15*a*, the third conductive wiring 15*b*, the first conductive wiring 13*a*, the second conductive wiring 14*b*, and the second conductive wiring 14*c* can be constituted of an electric conductor having a stretch property similar to those of the first electrode 13 and the second electrode 14.

The second conductive wiring 14*c*, the second conductive wiring 14*b*, and the first conductive wiring 13*a* are formed at positions that overlap one another when seen in the lamination direction but are arranged to be spaced from one another since the layers differ from one another.

Further, two pairs of the second conductive wiring 14*c*, the second conductive wiring 14*b*, and the first conductive wiring 13*a* are formed in parallel with each other so as to correspond to each row of the first electrodes 13 formed in two rows.

In FIG. 8, there is also a configuration in which the pillar 15 or the like is omitted.

Figure 9:
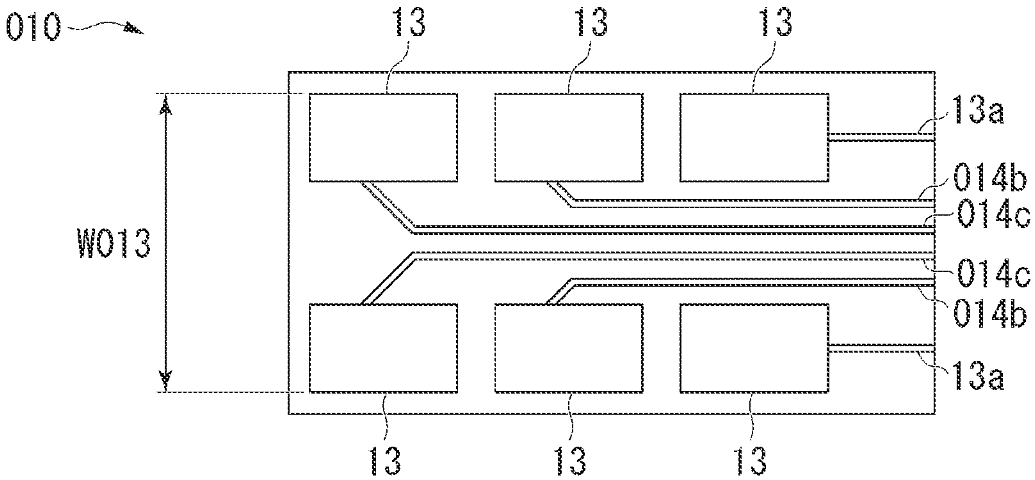
FIG. 9 is a schematic top view showing a lamination flexible circuit device (capacitance sensor) for comparison.

FIG. 9 is a schematic top view showing a capacitance sensor for comparison.

In a capacitance sensor 010 shown in FIG. 9, similarly to the capacitance sensor 10, six first electrodes 13 are arranged in two rows in a top view.

However, in the capacitance sensor 010, all of a first conductive wiring 13*a* connected to the first electrode 13 at the right end, a conductive wiring 014*b* connected to the first electrode 13 at the middle, and a conductive wiring 014*c* connected to the first electrode 13 at the right end are arranged in the same layer as the first electrode 13. Accordingly, the conductive wiring 014*b* and the conductive wiring 014*c* are arranged in parallel with each other between the rows formed of the first electrode 13.

In the present embodiment, in the capacitance sensor 10 shown in FIG. 8, the first electrode 13 is arranged such that the width in an upward-downward direction of the plane of paper is W13. On the other hand, in the capacitance sensor 010 shown in FIG. 9, the first electrode 13 is arranged such that the width in the upward-downward direction of the plane of paper is W013. As shown in FIG. 8 and FIG. 9, the width W013 is larger than the width W13.

This is because in the capacitance sensor 010 shown in FIG. 9, two conductive wirings 014*b* and two conductive wirings 014*c* are arranged to be spaced from each other between the rows of the first electrode 13. This spacing cannot be smaller than a predetermined size in order to reduce crosstalk in the conductive wiring 014*b* and the conductive wiring 014*c* or prevent reduction of the S/N ratio.

Therefore, in the configuration shown in FIG. 9 in which the conductive wiring 014*b* and the conductive wiring 014*c* are arranged in the same layer, it is necessary for the width W013 to be larger than the width W13 of the capacitance sensor 10 shown in FIG. 8. That is, in the capacitance sensor 10, by employing a wiring layout across the layers, downsizing is easy.

In this way, in the present embodiment, downsizing of the capacitance sensor 10 can be easily performed. Further, since the wiring layout across the layers is enabled, it is possible to improve the degree of freedom of the wiring and increase the distance between the wirings, and reduction of crosstalk and improvement of the S/N ratio can be easily performed.

In the present embodiment, it is also possible to provide effects similar to those of the embodiments described above.

Hereinafter, a capacitance sensor (lamination flexible circuit device) according to a fourth embodiment of the present invention will be described with reference to the drawings.

Figure 10:
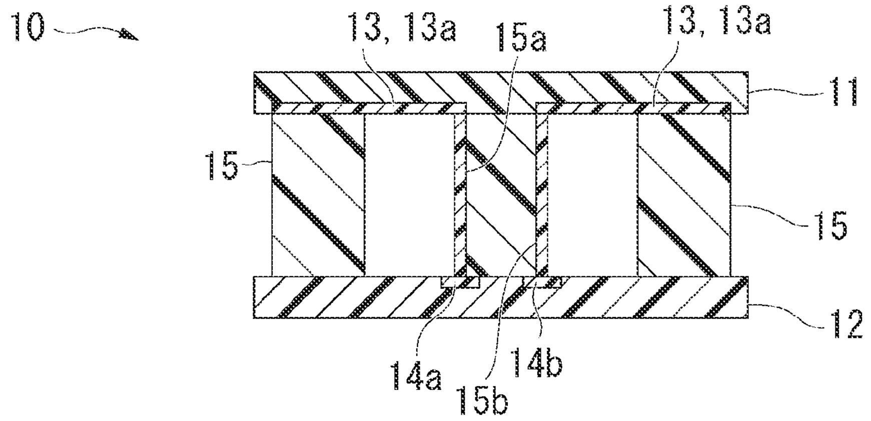
FIG. 10 is a schematic cross-sectional view showing a lamination flexible circuit device (capacitance sensor) according to a fourth embodiment of the present invention.

FIG. 10 is a schematic cross-sectional view showing a capacitance sensor in the present embodiment. The present embodiment is different from the first to third embodiments described above in terms of a third conductive wiring. Other configurations corresponding to those of the first to third embodiments described above may be denoted by the same reference numerals, and descriptions thereof may be omitted.

In the capacitance sensor 10 in the present embodiment, as shown in FIG. 10, two third conductive wirings which are a third conductive wiring 15*a* and a third conductive wiring 15*b* are formed on a single pillar 15. The third conductive wiring 15*a* and the third conductive wiring 15*b* are connected to a second conductive wiring 14*a* and a second conductive wiring 14*b* which are different from each other, respectively.

One end of a third conductive wiring 15*a* is connected to the first electrode 13 or the first conductive wiring 13*a*. Another end of the third conductive wiring 15*a* is connected to the second conductive wiring 14*a*. One end of another third conductive wiring 15*b* is connected to the first electrode 13 or the first conductive wiring 13*a*. Another end of the third conductive wiring 15*b* is connected to the second conductive wiring 14*b*.

The second conductive wiring 14*a* and the second conductive wiring 14*b* extend in a direction orthogonal to the plane of paper.

In the capacitance sensor 10 in the present embodiment, by sufficiently increasing the diameter of the pillar 15, the separation distance between the second conductive wiring 14*a* and the second conductive wiring 14*b* can be sufficiently increased, and thereby, it is possible to prevent the occurrence of crosstalk and sufficiently increase the S/N ratio. Further, since the third conductive wiring 15*a* and the third conductive wiring 15*b* that connect the layers can be arranged in a single pillar, it is possible to further improve the degree of freedom of the wiring layout.

The third conductive wiring 15*a* and the third conductive wiring 15*b* of the present embodiment may be spaced from each other to the degree in which crosstalk can be prevented, and each wiring diameter or the arrangement position in the cross-section of the pillar 15 is not particularly limited.

Further, the third conductive wiring 15*a* and the third conductive wiring 15*b* of the present embodiment can be arranged on surfaces facing each other in a pillar having a square column shape. Alternatively, the third conductive wiring 15*a* and the third conductive wiring 15*b* of the present embodiment can be arranged at corners facing each other. Further, if the pillar 15 has a large diameter, the third conductive wiring 15*a* and the third conductive wiring 15*b* of the present embodiment can be arranged on the same surface.

In the present embodiment, it is also possible to provide effects similar to those of the embodiments described above.

Hereinafter, a capacitance sensor (lamination flexible circuit device) according to a fifth embodiment of the present invention will be described with reference to the drawings.

Figure 11:
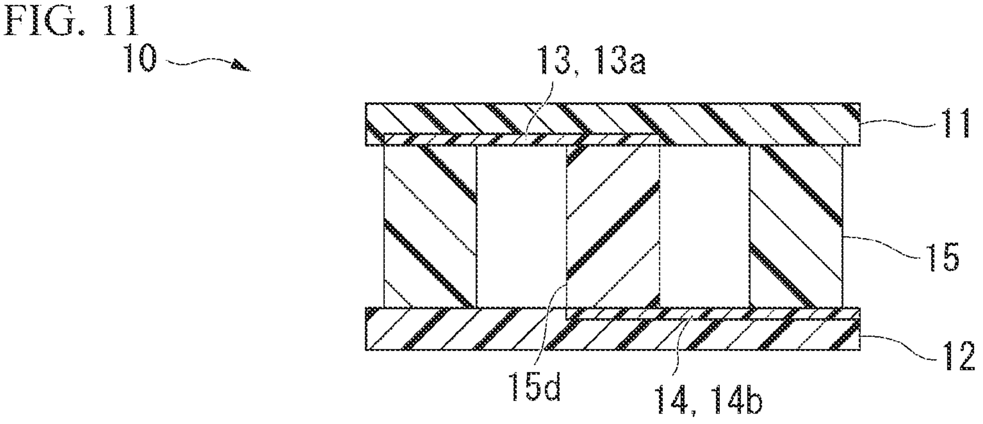
FIG. 11 is a schematic cross-sectional view showing a lamination flexible circuit device (capacitance sensor) according to a fifth embodiment of the present invention.

FIG. 11 is a schematic cross-sectional view showing a capacitance sensor in the present embodiment. The present embodiment is different from the first to fourth embodiments described above in terms of a third conductive wiring. Other configurations corresponding to those of the first to fourth embodiments described above may be denoted by the same reference numerals, and descriptions thereof may be omitted.

In the capacitance sensor 10 in the present embodiment, as shown in FIG. 11, the entire cross-section of one pillar 15 is a third conductive wiring 15*d*. In the third conductive wiring 15*d*, one end is connected to the first electrode 13 or the first conductive wiring 13*a*. Part of the one end of the third conductive wiring 15*d* may be connected to the first electrode 13 or the first conductive wiring 13*a*, and the entire surface of the one end of the third conductive wiring 15*d* can be connected to the first electrode 13 or the first conductive wiring 13*a*.

In the pillar 15 in which the entire cross-section is the third conductive wiring 15*d*, another end of the third conductive wiring 15*d* is connected to the second electrode 14 or the second conductive wiring 14*b*. Part of the other end of the third conductive wiring 15*d* may be connected to the second electrode 14 or the second conductive wiring 14*b*, and the entire surface of the other end of the third conductive wiring 15*d* can be connected to the second electrode 14 or the second conductive wiring 14*b*.

In the present embodiment, it is also possible to provide effects similar to those of the embodiments described above.

Hereinafter, a capacitance sensor (lamination flexible circuit device) according to a sixth embodiment of the present invention will be described with reference to the drawings.

Figure 12:
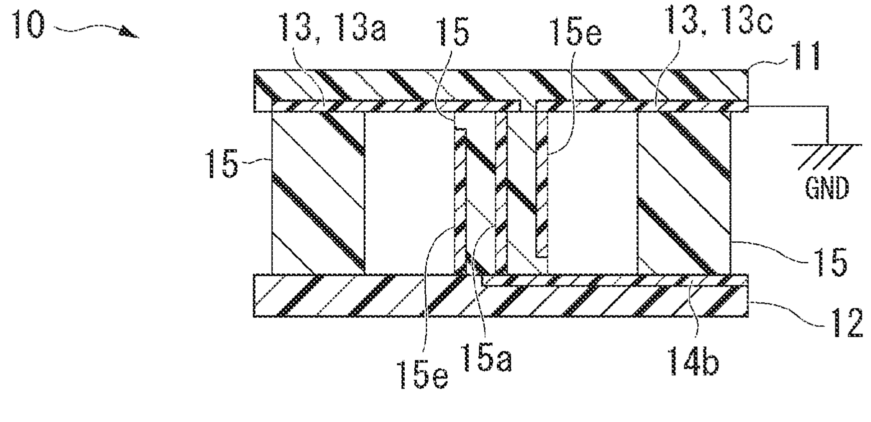
FIG. 12 is a schematic cross-sectional view showing a lamination flexible circuit device (capacitance sensor) according to a sixth embodiment of the present invention.
Figure 13:
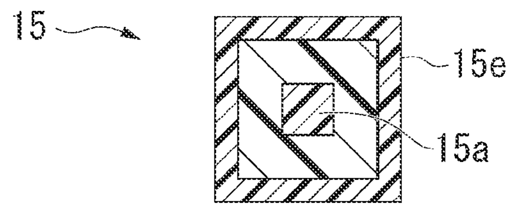
FIG. 13 is a schematic cross-sectional view showing a pillar in the lamination flexible circuit device (capacitance sensor) according to the sixth embodiment.

FIG. 12 is a schematic cross-sectional view showing a capacitance sensor in the present embodiment. FIG. 13 is a schematic cross-sectional view showing a pillar of the capacitance sensor in the present embodiment. The present embodiment is different from the first to fifth embodiments described above in terms of a third conductive wiring. Other configurations corresponding to those of the first to fifth embodiments described above may be denoted by the same reference numerals, and descriptions thereof may be omitted.

In the capacitance sensor 10 in the present embodiment, as shown in FIG. 12 and FIG. 13, a third conductive wiring 15*a* is formed at the center of one pillar 15. Further, a third conductive wiring 15*e* is formed around the pillar 15.

One end of the third conductive wiring 15*a* is connected to the first electrode 13 or the first conductive wiring 13*a*.

Another end of the third conductive wiring 15*a* is connected to the second conductive wiring 14*b*. The third conductive wiring 15*a* constitutes a signal line connected to the first electrode 13.

One end of the third conductive wiring 15*e* is connected to the first conductive wiring 13*c*. The third conductive wiring 15*e* is not connected to the first electrode 13. Another end of the third conductive wiring 15*e* is not connected to an electrical conductor in the same layer as the second conductive wiring 14*b*.

The first conductive wiring 13*c* is in a ground potential. Further, the third conductive wiring 15*e* connected to the first conductive wiring 13*c* is also in a ground potential. The third conductive wiring 15*e* is formed throughout the entire circumference of the pillar 15. The one end of the third conductive wiring 15*e* is spaced from the first electrode 13 or the first conductive wiring 13*a* so as not to be connected to the first electrode 13 or the first conductive wiring 13*a*. Further, the other end of the third conductive wiring 15*e* is spaced from the second conductive wiring 14*b* so as not to be connected to the second conductive wiring 14*b*.

The third conductive wiring 15*e* surrounds the entire circumference of the third conductive wiring 15*a* along the entire length of the third conductive wiring 15*a*. Further, the third conductive wiring 15*e* is in a ground potential. Thereby, the third conductive wiring 15*e* can act as a ground shield for the third conductive wiring 15*a*. Accordingly, it is possible to reduce crosstalk with respect to the third conductive wiring 15*a* as the signal line, improve noise resistance, and improve the S/N ratio.

A second conductive wiring that becomes a ground potential can be formed on the second electrode support layer 12 and be connected to the other end of the third conductive wiring 15*e*.

In the present embodiment, it is also possible to provide effects similar to those of the embodiments described above.

Hereinafter, a capacitance sensor (lamination flexible circuit device) according to a seventh embodiment of the present invention will be described with reference to the drawings.

Figure 14:
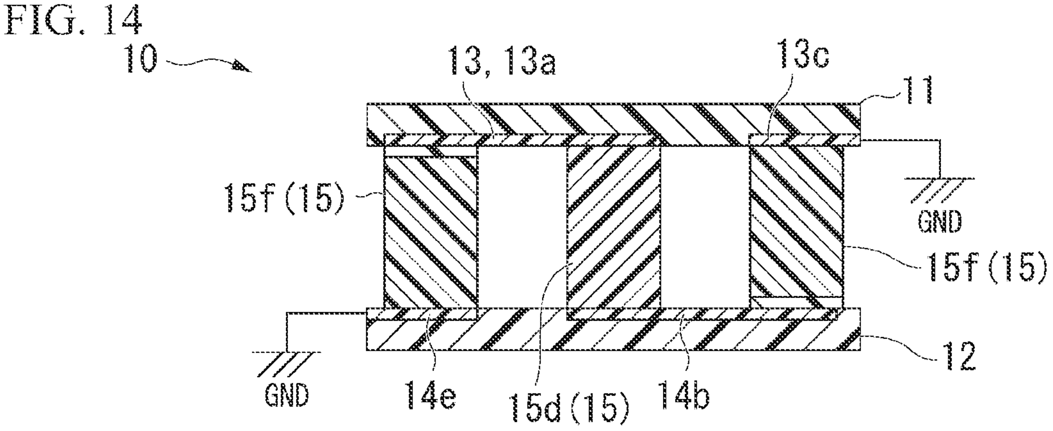
FIG. 14 is a schematic cross-sectional view showing a lamination flexible circuit device (capacitance sensor) according to a seventh embodiment of the present invention.
Figure 15:
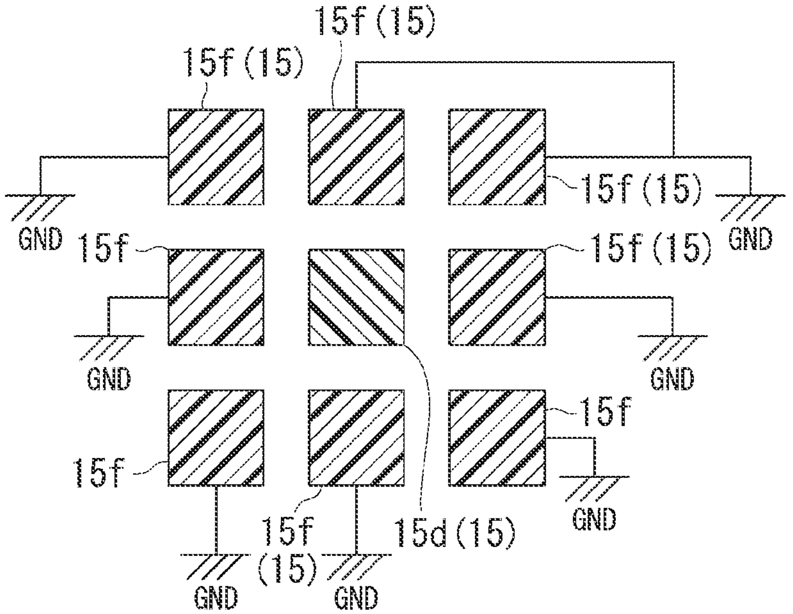
FIG. 15 is a schematic cross-sectional view showing a pillar in the lamination flexible circuit device (capacitance sensor) according to the seventh embodiment.

FIG. 14 is a schematic cross-sectional view showing a capacitance sensor in the present embodiment. FIG. 15 is a schematic cross-sectional view showing a pillar arrangement of the capacitance sensor in the present embodiment. The present embodiment is different from the first to sixth embodiments described above in terms of a third conductive wiring. Other configurations corresponding to those of the first to sixth embodiments described above may be denoted by the same reference numerals, and descriptions thereof may be omitted.

In the capacitance sensor 10 in the present embodiment, as shown in FIG. 14 and FIG. 15, the entire cross-section of one pillar 15 is a third conductive wiring 15*d*. One end of the third conductive wiring 15*d* is connected to the first electrode 13 or the first conductive wiring 13*a*. Part of the one end of the third conductive wiring 15*d* may be connected to the first electrode 13 or the first conductive wiring 13*a*, and the entire surface of the one end of the third conductive wiring 15*d* can be connected to the first electrode 13 or the first conductive wiring 13*a*. The third conductive wiring 15*d* constitutes a signal line connected to the first electrode 13.

Another end of the third conductive wiring 15*d* is connected to the second electrode 14 or the second conductive wiring 14*b*. Part of the other end of the third conductive wiring 15*d* may be connected to the second electrode 14 or the second conductive wiring 14*b*, and the entire surface of the other end of the third conductive wiring 15*d* can be connected to the second electrode 14 or the second conductive wiring 14*b*.

A plurality of pillars 15 in which the entire cross-section is the third conductive wiring 15*f* are arranged to be spaced in the in-plane direction of the first electrode support layer 11 and the second electrode support layer 12 around the pillar 15 in which the entire cross-section is the third conductive wiring 15*d*.

One end of the third conductive wiring 15*f* is connected to the first conductive wiring 13*c*. Part of the one end of the third conductive wiring 15*f* may be connected to the first conductive wiring 13*c*, and the entire surface of the one end of the third conductive wiring 15*f* can be connected to the first conductive wiring 13*c*. The one end of the third conductive wiring 15*f* is not connected to the first electrode 13 or the first conductive wiring 13*a*. That is, the one end of the third conductive wiring 15*f* is spaced from the first electrode 13 or the first conductive wiring 13*a*. The first conductive wiring 13*c* is in a ground potential.

Another end of the third conductive wiring 15*f* is connected to a second conductive wiring 14*e*. Part of the other end of the third conductive wiring 15*f* may be connected to the second conductive wiring 14*e*, and the entire surface of the other end of the third conductive wiring 15*f* can be connected to the second conductive wiring 14*e*. The other end of the third conductive wiring 15*f* is not connected to the second electrode 14 or the second conductive wiring 14*b*. That is, the other end of the third conductive wiring 15*f* is spaced from the second electrode 14 or the second conductive wiring 14*b*. The second conductive wiring 14*e* is in a ground potential.

The pillars 15 in which the entire cross-section is the third conductive wiring 15*f* surround the entire circumference of the pillar 15 in which the entire cross-section is the third conductive wiring 15*d* along the entire length of the pillar 15 as the third conductive wiring 15*d*.

Further, all of the third conductive wirings 15*f* are in a ground potential. Thereby, the third conductive wiring 15*f* can act as a ground shield for the third conductive wiring 15*d*. Accordingly, it is possible to reduce crosstalk with respect to the third conductive wiring 15*d* as the signal line, improve noise resistance, and improve the S/N ratio.

Although the pillars 15 as the third conductive wiring 15*f* are spaced from one another, the distances are not particularly limited if the distances can provide a function as a ground shield for the third conductive wiring 15*d*.

Further, in the present embodiment, since it is not necessary to form the third conductive wiring 15*a* within the pillar 15, it becomes possible to reduce the manufacturing process while providing the function as a ground shield.

In FIG. 15, it is shown that the GND is separately connected to all of the third conductive wirings 15*f* in order to indicate that the third conductive wiring 15*f* is in a ground potential; however, the embodiment is not limited to this configuration.

In the present embodiment, it is also possible to provide effects similar to those of the embodiments described above.

Hereinafter, a capacitance sensor (lamination flexible circuit device) according to an eighth embodiment of the present invention will be described with reference to the drawings.

Figure 16:
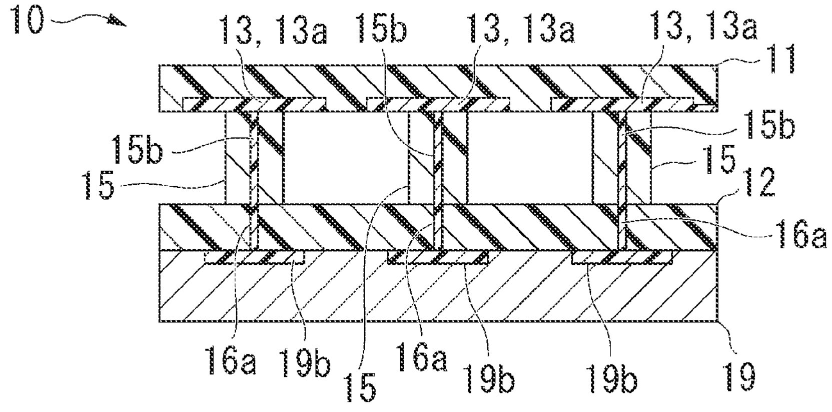
FIG. 16 is a schematic cross-sectional view showing a lamination flexible circuit device (capacitance sensor) according to an eighth embodiment of the present invention.

FIG. 16 is a schematic cross-sectional view showing a capacitance sensor in the present embodiment. The present embodiment is different from the first to seventh embodiments described above in terms of a circuit board. Other configurations corresponding to those of the first to seventh embodiments described above may be denoted by the same reference numerals, and descriptions thereof may be omitted.

In the capacitance sensor 10 of the present embodiment, as shown in FIG. 16, a circuit board 19 is connected to a rear surface of the second electrode support layer 12.

A wiring 19*b* is formed on the circuit board 19. A fourth conductive wiring 16*a* is connected to the wiring 19*b*. A third conductive wiring 15*b* is connected to the fourth conductive wiring 16*a*. The third conductive wiring 15*b* is connected to the first electrode 13 or the first conductive wiring 13*a*.

The third conductive wiring 15*b* is connected to the first electrode 13 or the first conductive wiring 13*a* of the present embodiment at a position which becomes an outline middle of the pillar 15 when seen in the lamination direction. The third conductive wiring 15*b* penetrates through the pillar 15 in the lamination direction and is connected to the fourth conductive wiring 16*a* formed on the second electrode support layer 12. The fourth conductive wiring 16*a* penetrates through the second electrode support layer 12 in the thickness direction. The fourth conductive wiring 16*a* extends in parallel with the third conductive wiring 15*b*. The extension directions of the fourth conductive wiring 16*a* and the third conductive wiring 15*b* match each other when seen in the lamination direction.

The third conductive wiring 15*b* is connected to one end portion of the fourth conductive wiring 16*a* in the same layer as a front surface of the second electrode support layer 12.

The wiring 19*b* is connected to another end portion of the fourth conductive wiring 16*a* in the same layer as a front surface of the circuit board 19.

The wiring 19*b* is in contact with a rear surface of the second electrode support layer 12 on a side spaced from the first electrode support layer 11. The wiring 19*b* is arranged in parallel with the first conductive wiring 13*a*. The wiring 19*b*, the fourth conductive wiring 16*a*, the third conductive wiring 15*b*, and the first electrode 13 or first conductive wiring 13*a* are located at positions that overlap one another when seen in the lamination direction.

Figure 17:
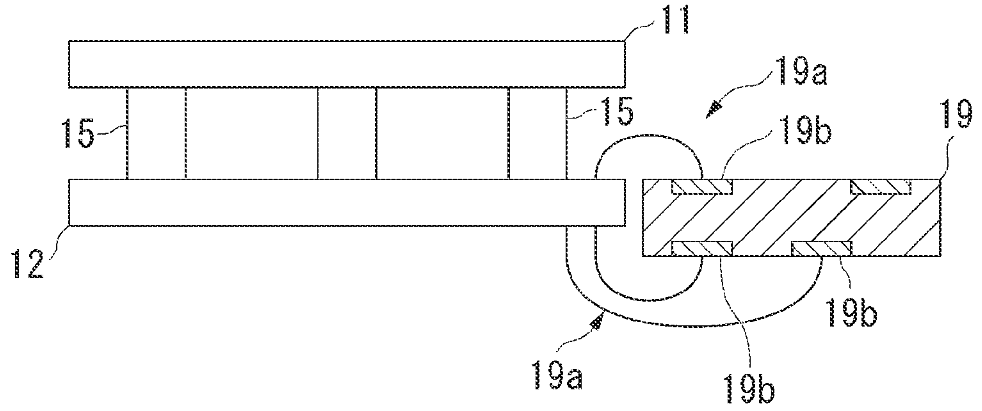
FIG. 17 is a schematic cross-sectional view showing a lamination flexible circuit device (capacitance sensor) for comparison.

FIG. 17 is a schematic cross-sectional view showing a capacitance sensor for comparison. In FIG. 17, configurations other than the configurations required for explanation are omitted.

The capacitance sensor 10 of the present embodiment is formed to have a shorter wiring to the circuit board (measurement board) 19 as compared to a configuration connected to the circuit board 19 by a cable 19*a* as shown in FIG. 17. That is, the capacitance sensor 10 of the present embodiment shown in FIG. 16 can realize a further downsized and high-density sensor. Further, by the wiring being short, it is possible to prevent crosstalk.

The circuit board 19 can be made of a rigid substrate. Alternatively, the circuit board 19 can be made of a flexible substrate.

In the present embodiment, it is also possible to provide effects similar to those of the embodiments described above.

Further, in the present embodiment, the second electrode support layer 12 can be omitted, and the other end of the third conductive wiring 15*b* can be directly connected to the wiring 19*b* of the circuit board 19.

Hereinafter, a capacitance sensor (lamination flexible circuit device) according to a ninth embodiment of the present invention will be described with reference to the drawings.

Figure 18:
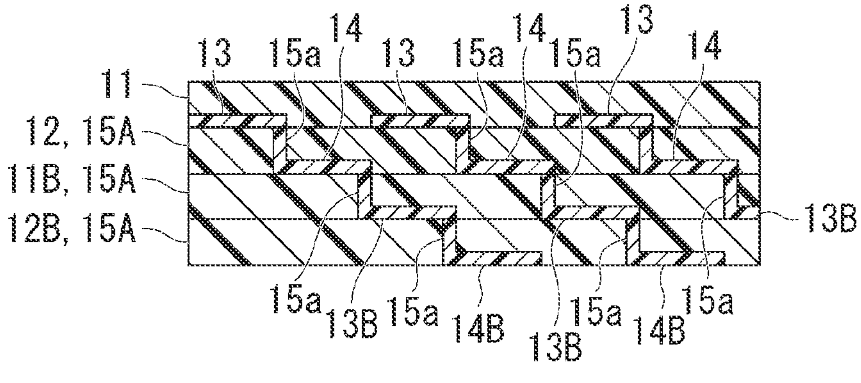
FIG. 18 is a schematic cross-sectional view showing a lamination flexible circuit device (capacitance sensor) according to a ninth embodiment of the present invention.

FIG. 18 is a schematic cross-sectional view showing a capacitance sensor in the present embodiment. The present embodiment is different from the first to eighth embodiments described above in terms of a lamination structure. Other configurations corresponding to those of the first to eighth embodiments described above may be denoted by the same reference numerals, and descriptions thereof may be omitted.

In the capacitance sensor 10 of the present embodiment, as shown in FIG. 18, a third electrode support layer 11B and a fourth electrode support layer 12B are laminated in addition to the first electrode support layer 11 and the second electrode support layer 12. In the drawing, the flexible base material 15A is shown integrally with the second electrode support layer 12, the third electrode support layer 11B, and the fourth electrode support layer 12B.

The first electrode support layer 11 includes a first electrode 13. The second electrode support layer 12 includes a second electrode 14. The third electrode support layer 11B includes a first electrode 13B. The fourth electrode support layer 12B includes a second electrode 14B.

The capacitance sensor 10 includes a third conductive wiring 15*a* penetrating through the second electrode support layer 12 in a lamination direction, a third conductive wiring 15*a* penetrating through the third electrode support layer 11B in the lamination direction, and a third conductive wiring 15*a* penetrating through the fourth electrode support layer 12B in the lamination direction.

The third conductive wiring 15*a* connects between the layers. In the present embodiment, the arrangement of the first electrode 13, the second electrode 14, the first electrode 13B, the second electrode 14B, and the third conductive wiring 15*a* is not limited to this configuration. Further, the third conductive wiring 15*a* also includes a fourth conductive wiring 16*a*.

In the capacitance sensor 10 of the present embodiment, according to the multilayered structure, it is possible to realize a finer wiring layout and realize a downsized and high-density sensor as a whole.

In the present embodiment, it is also possible to provide effects similar to those of the embodiments described above.

Hereinafter, a capacitance sensor (lamination flexible circuit device) according to a tenth embodiment of the present invention will be described with reference to the drawings.

Figure 19:
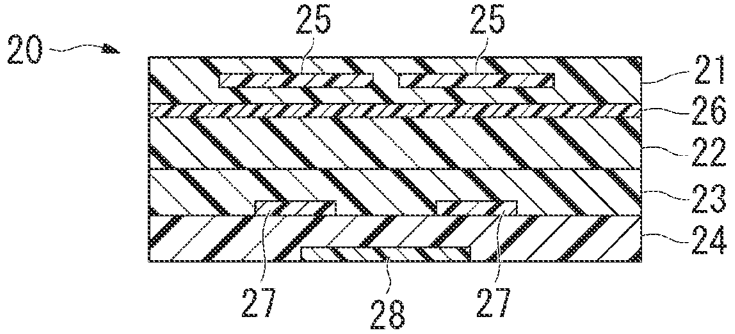
FIG. 19 is a schematic cross-sectional view showing a lamination flexible circuit device (capacitance sensor) according to a tenth embodiment of the present invention.

FIG. 19 is a schematic cross-sectional view showing a capacitance sensor in the present embodiment. The present embodiment is different from the first to ninth embodiments described above in terms of a layer and lamination of electrodes.

A capacitance sensor 20 in the present embodiment has a first electrode support layer 21, a second electrode support layer 22, a third electrode support layer 23, and a fourth electrode support layer 24, as shown in FIG. 19. The first electrode support layer 21 has a first electrode (first conductive portion) 25. The second electrode support layer 22 has a second electrode (second conductive portion) 26. The third electrode support layer 23 has a third electrode (third conductive portion) 27. The fourth electrode support layer 24 has a fourth electrode (third conductive portion) 28.

The first electrode support layer 21, the second electrode support layer 22, the third electrode support layer 23, and the fourth electrode support layer 24 correspond to the first electrode support layer 11 and the second electrode support layer 12 of the first and second embodiments, are laminated on each other, and are bonded to each other by an adhesion layer. All of the first electrode support layer 21, the second electrode support layer 22, the third electrode support layer 23, the fourth electrode support layer 24, and the flexible base material are formed of the same elastomer similarly to the embodiments described above. Formation of the flexible base material and bonding of each electrode support layer are similar to those of the embodiments described above. The flexible base material and the third wiring electrode are not shown in the drawing. The flexible base material can be a pillar or can be another structure. Further, the configuration of the third wiring electrode can also be appropriately selected from the embodiments described above.

The first electrode support layer 21 and the second electrode support layer 22 constitute a proximity sensor. The third electrode support layer 23 and the fourth electrode support layer 24 constitute a three-axis force sensor. Here, the second electrode 26 constitutes a GND shield layer. The second electrode 26 can be formed on the entire surface of the first electrode support layer 21, the second electrode support layer 22, the third electrode support layer 23, and the fourth electrode support layer 24 so as to electrically shield the first electrode 25, the third electrode 27, and the fourth electrode 28. Thereby, the upper proximity sensor constituted of the first electrode support layer 21 and the second electrode support layer 22 and the three-axis force sensor constituted of the third electrode support layer 23 and the fourth electrode support layer 24 can perform proximity detection on the upper side of the capacitance sensor 20 and three-axis force detection of a vertical force Fz and shear forces Fx and Fy on the lower side of the capacitance sensor 20, respectively.

In the capacitance sensor 20 in the present embodiment, the electrode support layers corresponding to the electrodes can be formed separately from the same material, and each layer can be bonded by the same elastomer. Here, each electrode support layer can be formed as a configuration divided in the thickness direction for each electrode formed at a different position in the thickness direction of the capacitance sensor 20. That is, depending on the electrode position arranged according to the desired sensor characteristic needs, the layers can be separated into multiple stages and bonded. Thereby, it is possible to facilitate manufacturing of the capacitance sensor 20, improve sensor sensitivity, and improve peeling resistance.

At this time, electrodes having a different position in the thickness direction can be arranged in the same electrode support layer so as not to overlap each other in plan view.

Simultaneously, since it becomes easier to manufacture the capacitance sensor having a complex multilayer structure, it becomes possible to provide a configuration in which a sensor having a different characteristic is further added.

Here, it becomes easier to form a pillar between the electrode support layers as in the second embodiment as needed and improve the sensor characteristic.

In the capacitance sensor 20 in the present embodiment, since the layers and the adhesion layer between the layers are formed of the same elastomer, it is possible to provide effects similar to those of the embodiments described above. Further, according to the first electrode 25, it is possible to measure proximity data with the outside of the sensor, and according to the third electrode 27 and the fourth electrode 28, it is possible to measure a three-axis force of an applied load.

In this case, the second electrode 26 is a ground electrode for separating the proximity sensor and the three-axis force sensor described above and can provide GND shield effects.

Here, in a sensor that acquires the proximity by way of a change in a capacitance value and acquires pressure by way of a resistance value, a data acquisition circuit is required for each acquisition. On the other hand, in the present embodiment, both of the proximity and the three-axis force can be acquired by the capacitance sensor 20, which is one capacitance-type sensor. Accordingly, the capacitance sensor 20 in the present embodiment can provide effects such as decreasing the size of a measurement circuit and downsizing the system.

As another form, the first electrode 25 can be eliminated, and the second electrode 26 can be used as a self-capacity proximity sensor. In this case, it is possible to switch the timing of acquiring pressure by the third electrode 27 and the fourth electrode 28 and the timing of acquiring the proximity data by the second electrode 26 in a time division manner.

Hereinafter, a capacitance sensor (lamination flexible circuit device) according to an eleventh embodiment of the present invention will be described with reference to the drawings.

Figure 20:
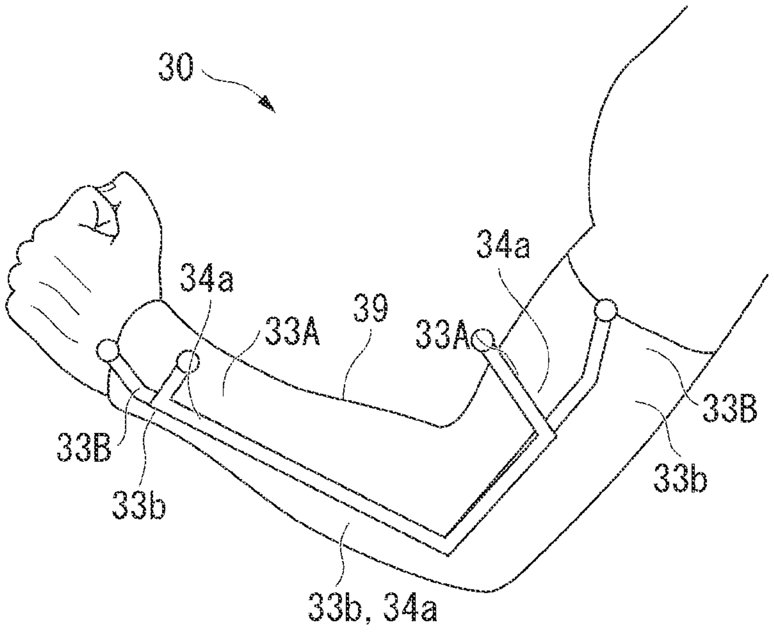
FIG. 20 is a schematic perspective view showing a lamination flexible circuit device (capacitance sensor) according to an eleventh embodiment of the present invention.
Figure 21:
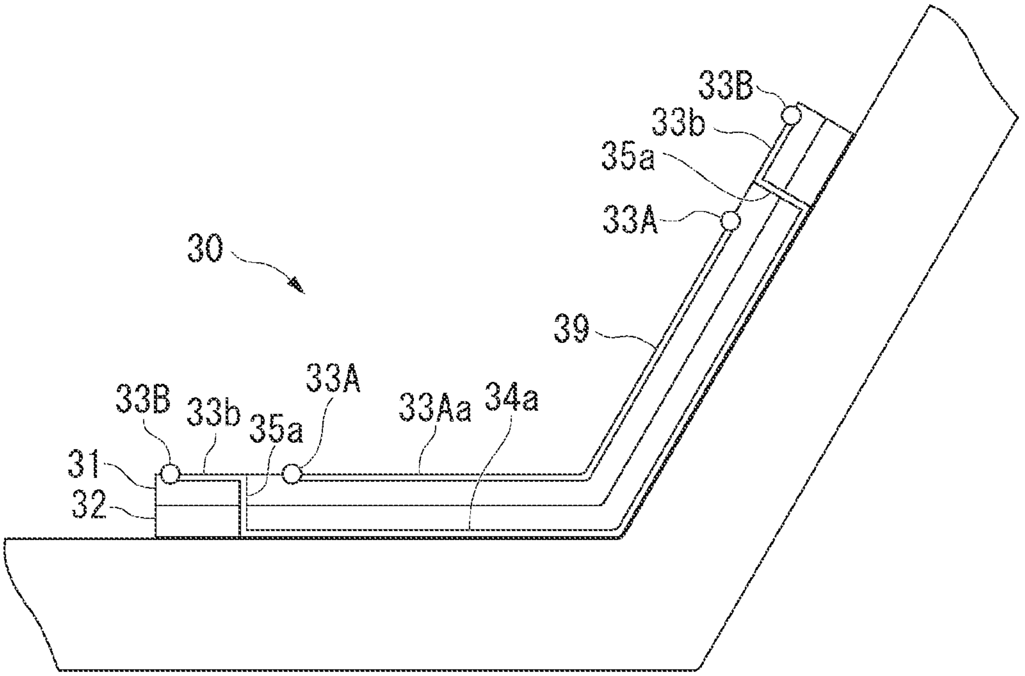
FIG. 21 is a schematic cross-sectional view showing the lamination flexible circuit device (capacitance sensor) according to the eleventh embodiment.

FIG. 20 is a schematic perspective view showing a capacitance sensor (lamination flexible circuit device) in the present embodiment. FIG. 21 is a schematic cross-sectional view showing the capacitance sensor (lamination flexible circuit device) in the present embodiment. The present embodiment is different from the first to tenth embodiments described above in terms of a layer and an arrangement of electrodes.

A capacitance sensor 30 in the present embodiment is formed on an arm sleeve 39 as shown in FIG. 20 and FIG. 21.

The capacitance sensor 30 is formed integrally with the arm sleeve 39 having a cylindrical shape. The capacitance sensor 30 has flexibility in which deformation such as folding or bending is possible together with the arm sleeve 39. The arm sleeve 39 is made of a flexible material having stretch properties such as a resin sheet or a cloth.

The capacitance sensor 30 has a first electrode support layer 31 and a second electrode support layer 32.

The first electrode support layer 31 and the second electrode support layer 32 are laminated integrally with the arm sleeve 39.

The first electrode support layer 31 has a first electrode (first conductive portion) 33Aa, a first connector (first conductive portion) 33A, a first conductive wiring 33*b*, and a first connector (first conductive portion) 33B.

The second electrode support layer 32 has a second electrode (second conductive portion, second conductive wiring) 34*a*. A flexible base material 15A is formed between the first electrode support layer 31 and the second electrode support layer 32. In place of the flexible base material 15A, a pillar 15 may be formed between first electrode support layer 31 and the second electrode support layer 32.

The flexible base material 15A and the pillar 15 are not shown in the drawing.

The first electrode 33Aa is connected to the first connector 33A. One end of the first conductive wiring 33*b* is connected to the first connector 33B, and another end of the first conductive wiring 33*b* is connected to the third conductive wiring 35*a*. The third conductive wiring 35*a* is connected to the second electrode 34*a*. The first electrode 33A is connected to the first conductive wiring 33*b*. The first electrode 33Aa, the first connector 33A, the first conductive wiring 33*b*, and the first connector 33B are formed in the same layer.

The first electrode 33Aa and the second conductive wiring 34*a* are arranged to overlap each other when seen in the lamination direction of the first electrode support layer 31 and the second electrode support layer 32. The first electrode 33Aa and the second conductive wiring 34*a* are electrodes that detect a capacitance in the capacitance sensor. Similarly, a circuit board 19 or the like is connected to the first connector 33A and the first connector 33B.

The first electrode support layer 31 corresponds to first electrode support layer 11. The second electrode support layer 32 corresponds to the second electrode support layer 12. The first electrode 33 corresponds to the first electrode 13. The first electrode 33Aa corresponds to the first electrode 13. The first conductive wiring 33*a* corresponds to the first conductive wiring 13*a* or the like. The first conductive wiring 33*b* corresponds to the first conductive wiring 13*b* or the like. The second conductive wiring 34*a* corresponds to the second conductive wiring 14*b* or the like.

The first electrode 33Aa and the second conductive wiring 34*a* of the capacitance sensor 30 are located at a joint portion such as the elbow in the arm sleeve 39 mounted on the arm.

When an external force is applied to the arm sleeve 39, that is, for example, when a wearer bends the elbow, the arm sleeve 39 folds and deforms integrally with the elbow. Then, the capacitance sensor 30 folds as shown in FIG. 21. Then, due to the position change of the first electrode 33Aa and the second conductive wiring 34*a*, the capacitance of the first electrode 33Aa and the second conductive wiring 34*a* changes. By detecting this capacitance change, it becomes possible to measure the movement of the arm or the like as the external load F similarly to the embodiments described above.

Further, the capacitance sensor 30 not only can measure the movement of the arm due to the bending of the elbow but also can measure a force of contact between the arm and the outside such as contact between the external environment and the arm or being touched by a person regardless of the bending of the elbow.

As the external load F in the measurement of the force of contact, it is conceivable that both of the force of contact between the arm and the outside and the force of the movement of the arm be applied to the arm sleeve 39. In this case, separation of contributing factors of the two forces may be performed.

When the separation of contributing factors of the two forces is performed, a method can be used in which another sensor such as a joint angle sensor is also used in addition to the capacitance sensor 30, and data from both sensors are used. Alternatively, when the separation of contributing factors of the two forces is performed, a method using machine learning can be used for the output data of the capacitance sensor 30.

The capacitance sensor 10 according to the present embodiment can also detect the change in capacitance between the first electrode 33Aa and the second electrode 34*a* by way of the variation of an interelectrode distance d similarly to the embodiments described above.

In the present embodiment, it is possible to provide effects similar to those of the embodiment described above.

Hereinafter, a flexible actuator (lamination flexible circuit device) according to a twelfth embodiment of the present invention will be described with reference to the drawings.

Figure 22:
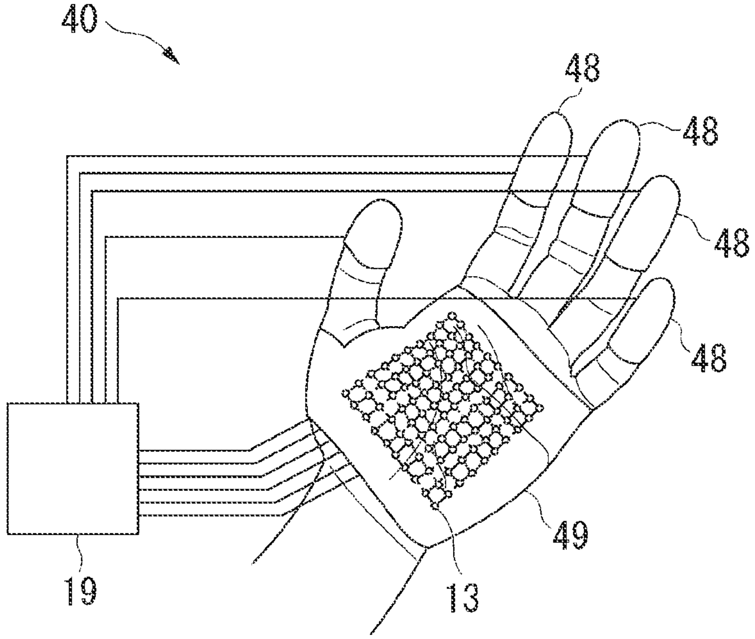
FIG. 22 is a schematic perspective view showing a lamination flexible circuit device (flexible actuator) according to a twelfth embodiment of the present invention.

FIG. 22 is a schematic perspective view showing a flexible actuator (lamination flexible circuit device) in the present embodiment. The present embodiment is different from the first to eleventh embodiments described above in terms of a layer and an arrangement of electrodes. Other configurations corresponding to those of the embodiments described above may be denoted by the same reference numerals, and descriptions thereof may be omitted.

A flexible actuator 40 in the present embodiment includes, as shown in FIG. 22, a touch actuator sheet 49 mounted on the palm and a fingertip 48 mounted on the tip of a finger.

The touch actuator sheet 49 is made of a flexible sheet formed in a glove shape. The fingertip 48 is made of a flexible sheet formed in a cup shape.

The touch actuator sheet 49 has a plurality of first electrodes 13 similarly to the third embodiment shown in FIG. 8. In the plurality of first electrodes 13, a circuit connected to the circuit board 19 is formed of a first conductive wiring 13*a* and a second conductive wiring 14*a* formed on the first electrode support layer 11 and the second electrode support layer 12, a third conductive wiring 15*a* formed between these layers, and a fourth conductive wiring 16*a*. The plurality of first electrodes 13 are in contact with the wearer's palm.

The fingertip 48 also has a plurality of first electrodes 13 similarly. Further, in the plurality of first electrodes 13, a circuit connected to the circuit board 19 is formed of a first conductive wiring 13*a* and a second conductive wiring 14*a* formed on the first electrode support layer 11 and the second electrode support layer 12, a third conductive wiring 15*a* formed between these layers, and a fourth conductive wiring 16*a*. The plurality of first electrodes 13 are in contact with the tip of wearer's finger.

In the touch actuator sheet 49 and the fingertip 48, the plurality of first electrodes 13 form an electrode array.

The flexible actuator 40 applies electrical stimulation directly to the skin and thereby generates fine tactile sense for the touch actuator sheet 49, the fingertip 48, the palm and the tip of a finger.

Here, by decreasing the area of the first electrode 13 and increasing the number of arrangements of the first electrode 13, it is possible to apply high-resolution stimulation to the skin. By applying high-resolution stimulation to the skin, it is possible to generate fine tactile sense.

In the flexible actuator 40, the touch actuator sheet 49 and the fingertip 48 can flexibly deform in accordance with the movement of the palm and the tip of a finger. Thereby, even when the touch actuator sheet 49 and the fingertip 48 deform, a contact state with the skin of the palm and the tip of a finger is maintained.

The flexible actuator 40 can be easily downsized by employing the wiring layout across the layers. High-resolution stimulation to the skin is realized, and it is possible to generate fine tactile sense.

In the present embodiment, it is also possible to provide effects similar to those of the embodiments described above.

Hereinafter, a flexible battery (lamination flexible circuit device) according to a thirteenth embodiment of the present invention will be described with reference to the drawings.

Figure 23:
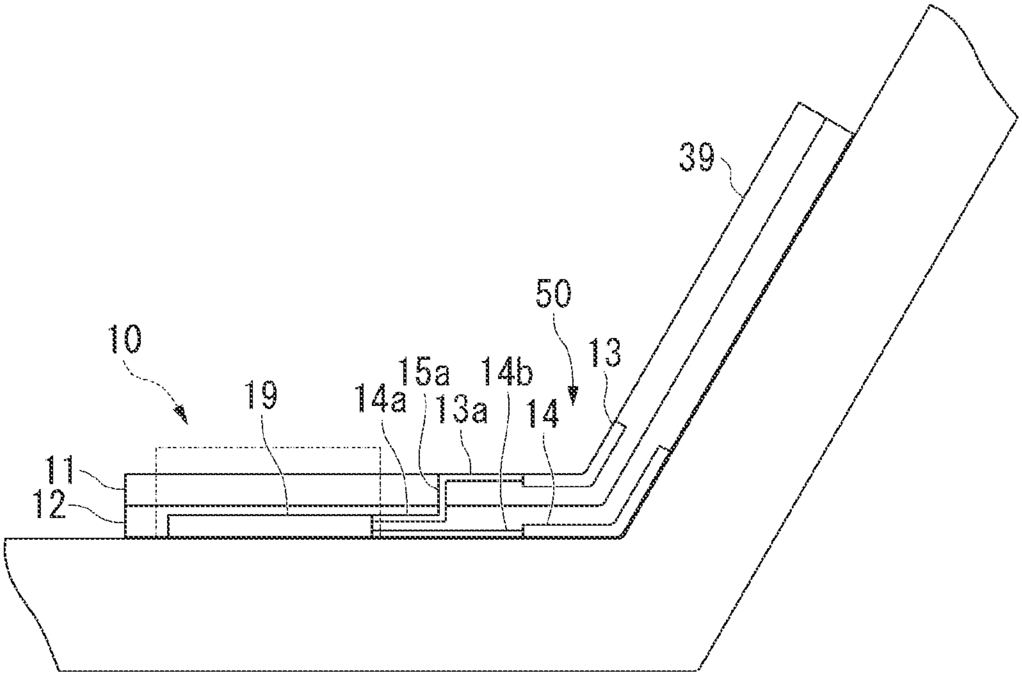
FIG. 23 is a schematic perspective view showing a lamination flexible circuit device (flexible battery) according to a thirteenth embodiment of the present invention.
Figure 24:
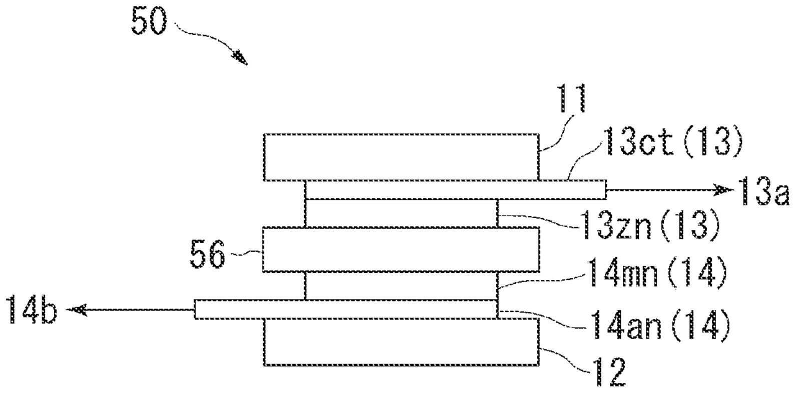
FIG. 24 is a schematic cross-sectional view showing the lamination flexible circuit device (flexible battery) according to the thirteenth embodiment.

FIG. 23 is a schematic perspective view showing a flexible battery (lamination flexible circuit device) in the present embodiment. FIG. 24 is a schematic cross-sectional view showing the flexible battery (lamination flexible circuit device) in the present embodiment. The present embodiment is different from the first to twelfth embodiments described above in terms of a layer and an arrangement of electrodes. Other configurations corresponding to those of the embodiments described above may be denoted by the same reference numerals, and descriptions thereof may be omitted.

A flexible battery 50 in the present embodiment is formed integrally with the arm sleeve 39 together with the capacitance sensor 10 as shown in FIG. 23 and FIG. 24.

The flexible battery 50 supplies electric power to the circuit board 19 for driving of the capacitance sensor 10.

The flexible battery 50 has a first electrode 13, a second electrode 14, and a separator layer 56.

The first electrode 13 is connected to a first conductive wiring 13*a*. The first conductive wiring 13*a* is connected to a third conductive wiring 15*a*. The third conductive wiring 15*a* is connected to a second conductive wiring 14*a*. The second conductive wiring 14*a* is connected to the circuit board 19. The second electrode 14 is connected to a second conductive wiring 14*b*. The second conductive wiring 14*b* is connected to the circuit board 19. The second conductive wiring 14*a* and the second conductive wiring 14*b* may be arranged in the same layer. The second conductive wiring 14*a* and the second conductive wiring 14*b* may be arranged in different layers within the second electrode support layer 12.

The flexible battery 50 in the present embodiment is, for example, an aqueous stretch zinc manganese dioxide (Zn—$MnO_2$) secondary battery. The flexible battery 50 is a single polymer-based battery having stretch properties.

The first electrode 13 is a cathode (positive electrode). The second electrode 14 is an anode (negative electrode). The separator layer 56 is laminated between the first electrode 13 and the second electrode 14. The first electrode 13 may be an anode (negative electrode), and the second electrode 14 cathode (positive electrode) may be a cathode (positive electrode).

In the first electrode 13, a carbon conductive layer (collector) 13*ct* including carbon nanofibers and a Zn layer (electrolyte layer) 13*zn* including Zn particles and carbon black particles are laminated. In the second electrode 14, a carbon conductive layer (collector) 14*an* including carbon nanofibers and a $MnO_2$ layer (electrolyte layer) 14 nm including $MnO_2$ particles and carbon black particles are laminated.

The separator layer 56 is a porous film in which SIBS is an elastomer, a polymer, or a binder. The separator layer 56 is a stretch film having high porosity and electrical isolation performance. The separator layer 56 corresponds to the flexible base material 15A. When the carbon conductive layer (collector) 13*ct* is regarded as the first electrode support layer 11, and the carbon conductive layer (collector) 14*an* is regarded as the second electrode support layer 12, the Zn layer 13*zn* and the $MnO_2$ layer 14*nm* may correspond to the flexible base material 15A.

The Zn layer 13*zn* and the $MnO_2$ layer 14*nm* are in contact with front and rear surfaces of the separator layer 56, respectively. The carbon conductive layer 13*ct*, the Zn layer 13*zn*, the separator layer 56, the $MnO_2$ layer 14*nm*, and the carbon conductive layer 14*an* constitute cells of the flexible battery 50.

In all of the cells of the flexible battery 50, each layer is formed by encapsulating the particles as the battery described above or the like in a biocompatible polymer which is a triblock thermoplastic copolymer, for example, a poly (styrene-isobutylene-styrene) SIBS. Thereby, the cells of the flexible battery 50 have sufficient flexibility.

In the arm sleeve 39, the flexible base material 15A and the pillar 15 can be arranged between the first electrode support layer 11 and the second electrode support layer 12 except a region corresponding to the flexible battery 50.

The flexible battery 50 can be located at a joint portion such as the elbow in the arm sleeve 39 mounted on the arm. Alternatively, the flexible battery 50 may be arranged at a position displaced from the elbow.

When an external force is applied to the arm sleeve 39, that is, for example, when a wearer bends the elbow, the arm sleeve 39 folds and deforms integrally with the elbow. Then, the flexible battery 50 folds as shown in FIG. 23. Then, the first electrode 13, the separator layer 56, and the second electrode 14 fold. By the flexible battery 50 having sufficient flexibility, these layers do not peel from each other, and it is possible to maintain an electromotive force regardless of deformation. Thereby, the flexible battery 50 can maintain an electric power supply state for driving the capacitance sensor 10 even when deforming integrally with the arm sleeve 39.

In the present embodiment, it is also possible to provide effects similar to those of the embodiments described above.

Further, in the present invention, individual configurations in the embodiments described above can be individually selected and suitably combined.

What is claimed is:

1. A lamination flexible circuit device formed of a plurality of laminated layers, the lamination flexible circuit device comprising:

a first conductive portion;

a second conductive portion arranged to face the first conductive portion;

a first conductive wiring in a layer identical to the first conductive portion;

a second conductive wiring in a layer identical to the second conductive portion; and a flexible base material having a dielectric property and elasticity and arranged between the first conductive portion and the second conductive portion, wherein a third conductive wiring connecting the first conductive portion or the first conductive wiring to the second conductive portion or the second conductive wiring between layers is arranged on the flexible base material, the lamination flexible circuit device comprises: a plurality of third conductive wirings each of which is the third conductive wiring and which are arranged to be spaced from each other in a direction intersecting a lamination direction, and the third conductive wiring that is connected to the first conductive portion or the second conductive portion is arranged to be surrounded by the third conductive wiring that is not connected to the first conductive portion or the second conductive portion.

2. The lamination flexible circuit device according to claim 1, comprising:

a first layer including the first conductive portion and the first conductive wiring; and a second layer including the second conductive portion and the second conductive wiring, wherein at least one of the first layer and the second layer is formed of a material identical to the flexible base material.

3. The lamination flexible circuit device according to claim 2, wherein the flexible base material is formed of a plurality of pillars extending in a lamination direction between the first layer and the second layer and arranged to be spaced from each other in a direction intersecting the lamination direction.

4. The lamination flexible circuit device according to claim 3, wherein the third conductive wiring penetrates through an inside of a pillar among the plurality of pillars in the lamination direction, and the third conductive wiring is exposed to a surface of the pillar or is not exposed to the surface of the pillar.

5. The lamination flexible circuit device according to claim 3, wherein the third conductive wiring extends in the lamination direction within a pillar among the plurality of pillars between the first layer and the second layer, and the third conductive wiring is exposed to a surface of the pillar or is not exposed to the surface of the pillar.

6. The lamination flexible circuit device according to claim 2, comprising:

a fourth conductive wiring that penetrates through at least one of the first layer and the second layer in a lamination direction.

7. The lamination flexible circuit device according to claim 2, wherein a circuit board overlapping the first layer or the second layer in a lamination direction is connected in the lamination direction to at least one of the first layer and the second layer.

8. A capacitance sensor comprising:

the lamination flexible circuit device according to claim 1, wherein the first conductive portion has a section overlapping the second conductive portion when seen in a lamination direction, and a capacitance between the first conductive portion and the second conductive portion is detected.

9. A flexible actuator comprising:
the lamination flexible circuit device according to claim 1,
wherein the first conductive portion or the first conductive wiring has a section overlapping the second conductive portion or the second conductive wiring when seen in a lamination direction.

10. A flexible battery comprising:
a lamination flexible circuit device formed of a plurality of laminated layers, the lamination flexible circuit device comprising:
a first conductive portion;
a second conductive portion arranged to face the first conductive portion;
a first conductive wiring in a layer identical to the first conductive portion;
a second conductive wiring in a layer identical to the second conductive portion; and
a flexible base material having a dielectric property and elasticity and arranged between the first conductive portion and the second conductive portion,
wherein a third conductive wiring connecting the first conductive portion or the first conductive wiring to the second conductive portion or the second conductive wiring between layers is arranged on the flexible base material,
the first conductive portion has a section overlapping the second conductive portion when seen in a lamination direction,
the first conductive portion is an anode, the second conductive portion is a cathode, and
a separator layer is provided between the first conductive portion and the second conductive portion.

11. A lamination flexible circuit device formed of a plurality of laminated layers, the lamination flexible circuit device comprising:
a first conductive portion;
a second conductive portion arranged to face the first conductive portion;
a first conductive wiring in a layer identical to the first conductive portion;
a second conductive wiring in a layer identical to the second conductive portion;
a flexible base material having a dielectric property and elasticity and arranged between the first conductive portion and the second conductive portion;
a first layer including the first conductive portion and the first conductive wiring; and
a second layer including the second conductive portion and the second conductive wiring,
wherein a third conductive wiring connecting the first conductive portion or the first conductive wiring to the second conductive portion or the second conductive wiring between layers is arranged on the flexible base material,
at least one of the first layer and the second layer is formed of a material identical to the flexible base material, and
a circuit board overlapping the first layer or the second layer in a lamination direction is connected in the lamination direction to at least one of the first layer and the second layer.

12. The lamination flexible circuit device according to claim 11,
wherein the flexible base material is formed of a plurality of pillars extending in a lamination direction between the first layer and the second layer and arranged to be spaced from each other in a direction intersecting the lamination direction.

13. The lamination flexible circuit device according to claim 12,
wherein the third conductive wiring penetrates through an inside of a pillar among the plurality of pillars in the lamination direction, and
the third conductive wiring is exposed to a surface of the pillar or is not exposed to the surface of the pillar.

14. The lamination flexible circuit device according to claim 12,
wherein the third conductive wiring extends in the lamination direction within a pillar among the plurality of pillars between the first layer and the second layer, and
the third conductive wiring is exposed to a surface of the pillar or is not exposed to the surface of the pillar.

15. The lamination flexible circuit device according to claim 11, comprising:
a plurality of third conductive wirings each of which is the third conductive wiring and which are arranged to be spaced from each other in a direction intersecting a lamination direction, and
the third conductive wiring that is connected to the first conductive portion or the second conductive portion is arranged to be surrounded by the third conductive wiring that is not connected to the first conductive portion or the second conductive portion.

16. The lamination flexible circuit device according to claim 11, comprising:
a fourth conductive wiring that penetrates through at least one of the first layer and the second layer in a lamination direction.

17. A capacitance sensor comprising:
the lamination flexible circuit device according to claim 11,
wherein the first conductive portion has a section overlapping the second conductive portion when seen in a lamination direction, and a capacitance between the first conductive portion and the second conductive portion is detected.

18. A flexible actuator comprising:
the lamination flexible circuit device according to claim 11,
wherein the first conductive portion or the first conductive wiring has a section overlapping the second conductive portion or the second conductive wiring when seen in a lamination direction.

* * * * *